United States Patent
Yamakawa et al.

(10) Patent No.: US 7,054,608 B2
(45) Date of Patent: May 30, 2006

(54) MULTILAYER ELECTRONIC COMPONENT AND COMMUNICATION APPARATUS AND METHOD

(75) Inventors: Takehiko Yamakawa, Toyonaka (JP); Toshio Ishizaki, Kobe (JP); Toru Yamada, Katano (JP); Shoichi Kitazawa, Nishinomiya (JP); Tomoyuki Iwasaki, Joyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 616 days.

(21) Appl. No.: 10/044,541

(22) Filed: Jan. 11, 2002

(65) Prior Publication Data

US 2002/0119764 A1 Aug. 29, 2002

(30) Foreign Application Priority Data

Jan. 11, 2001 (JP) .............................. 2001-004187

(51) Int. Cl.
*H04B 1/26* (2006.01)
*H03H 7/00* (2006.01)

(52) U.S. Cl. .......................... 455/323; 455/25; 455/83; 333/185; 333/134; 361/311

(58) Field of Classification Search .................. 455/73, 455/83, 323, 25; 333/24 R, 140, 185, 134, 333/126, 129, 204, 205; 361/311, 313, 320
See application file for complete search history.

(56) References Cited

U.S. PATENT DOCUMENTS

| | | | | |
|---|---|---|---|---|
| 5,719,539 A | * | 2/1998 | Ishizaki et al. | ............. 333/204 |
| 6,002,576 A | * | 12/1999 | Asakura et al. | ............. 361/311 |
| 6,304,158 B1 | * | 10/2001 | Nishijima et al. | ........... 333/134 |
| 6,633,207 B1 | * | 10/2003 | Hidaka et al. | ............... 333/134 |
| 2002/0039059 A1 | * | 4/2002 | Kanba et al. | ................ 333/204 |
| 2004/0087280 A1 | * | 5/2004 | Watanabe et al. | ............. 455/83 |
| 2005/0184832 A1 | * | 8/2005 | Ono et al. | ................... 333/204 |

FOREIGN PATENT DOCUMENTS

| | | |
|---|---|---|
| JP | 6-20839 | 1/1994 |
| JP | 9-320849 | 12/1997 |
| JP | 11-162740 | 6/1999 |

* cited by examiner

*Primary Examiner*—Lana Le
(74) *Attorney, Agent, or Firm*—RatnerPrestia

(57) ABSTRACT

A multilayer electronic component has a multilayered product laminating a plurality of dielectric sheets as one piece,
  a plurality of grounded electrodes provided among the dielectric sheets being different inside the multilayered product, and
  inductor electrodes provided on the dielectric sheet surfaces not having the plurality of grounded electrodes inside the multilayered product,
  wherein all or part of the inductor electrodes are placed so as not to be sandwiched by the plurality of grounded electrodes.

3 Claims, 17 Drawing Sheets

MULTILAYER ELECTRONIC COMPONENT AND COMMUNICATION APPARATUS AND METHOD

DETAILED DESCRIPTION OF THE INVENTION

1. Field of the Invention

The present invention relates to a multilayer electronic component used in a mobile communication apparatus such as a portable telephone.

2. Related Art of the Invention

In recent years, as communication apparatuses become smaller, a multilayer electronic component is often used in a circuit of a portable telephone and so on. The multilayer electronic component has an inductor, a capacitor and so on inside a multilayered product, has a filter, a switching circuit and so on configured, and has an SAW, a semiconductor and so on implemented atop it, so that it can be further miniaturized by integrating composite devices.

Hereafter, an example of the above multilayer electronic component in the past will be described by referring to the drawings.

FIG. 13 is an internal view of the multilayer electronic components in the past. The multilayer electronic components have dielectric layers 1301 to 1304 laminated respectively. A dielectric layer 1302 has an grounded electrode 1305 placed thereon, and a dielectric layer 1303 has inductor electrodes 1306 and 1307 placed thereon, and the dielectric layer 1304 has an grounded electrode 1308 placed thereon. In addition, the dielectric layer 1301 has an exterior inductor 1309 connected to the inductor electrodes 1306 via a via hole of the dielectric layer 1302. Moreover, the grounded electrodes 1305 and 1308 are connected to a side electrode 1310.

However, the above configuration has a problem that an impedance becomes low because the inductor electrodes 1306 and 1307 are close to the grounded electrodes 1305 and 1308, and so the exterior inductor 1309 needs to be separately connected in the case where a high impedance is required.

In addition, it has a problem that good isolation between the inductor electrodes cannot be kept because the inductor electrodes 1306 and 1307 are close and an electromagnetic field connection is made.

An object of the present invention is, considering the above problem, to obtain the multilayer electronic component, and its method of manufacture capable of providing an inductor having a high impedance in the multilayered product without using an exterior inductor and providing a plurality of inductors that are close and have little influence over one another.

One aspect of the present invention is a multilayer electronic component having a multilayered product laminating a plurality of dielectric sheets as one piece, a plurality of grounded electrodes provided among said dielectric sheets being different inside said multilayered product, and inductor electrodes provided on said dielectric sheet surfaces not having said plurality of grounded electrodes inside said multilayered product, wherein all or part of said inductor electrodes are placed in position so as not to be sandwiched by said plurality of grounded electrodes.

Another aspect of the present invention is the multilayer electronic component, wherein the part of said inductor electrodes not sandwiched by said plurality of grounded electrodes is one portion of one inductor electrode.

Still another aspect of the present invention is the multilayer electronic component, wherein the part of said inductor electrodes not sandwiched by said plurality of grounded electrodes are one piece or a plurality of pieces of a plurality of the inductor electrodes.

Yet still another aspect of the present invention is the multilayer electronic component, wherein all or part of said inductor electrodes not sandwiched by said plurality of grounded electrodes are placed on the dielectric sheets not sandwiched by said plurality of grounded electrodes.

Still yet another aspect of the present invention is the multilayer electronic component, wherein all or part of said inductor electrodes not sandwiched by said plurality of grounded electrodes are placed on the dielectric sheets sandwiched by said plurality of grounded electrodes.

A further aspect of the present invention is the multilayer electronic component, wherein part of said inductor electrodes not sandwiched by said plurality of grounded electrodes are formed by having slots formed on said grounded electrodes overlap said inductor electrodes.

A still further aspect of the present invention is the multilayer electronic component, wherein all of said inductor electrodes not sandwiched by said plurality of grounded electrodes are formed by having slots having substantially the same shape as said inductor electrodes formed on said grounded electrodes overlap said inductor electrodes.

A yet further aspect of the present invention is the multilayer electronic component, wherein part and other remaining portions of said inductor electrodes not sandwiched by said plurality of grounded electrodes are placed on said dielectric sheets that are the same.

A still yet further aspect of the present invention is a multilayer electronic component having a multilayered product laminating a plurality of dielectric sheets as one piece, a plurality of grounded electrodes provided among said dielectric sheets being different inside said multilayered product, and a plurality of inductor electrodes provided on said dielectric sheet surfaces not having said plurality of grounded electrodes inside said multilayered product, and internal grounded electrodes provided among said plurality of inductor electrodes.

An additional aspect of the present invention is the multilayer electronic component, wherein said internal grounded electrodes are connected to said plurality of grounded electrodes via holes.

A still additional aspect of the present invention is the multilayer electronic component, wherein all or part of said plurality of inductor electrodes are placed on said dielectric sheets that are the same.

A yet additional aspect of the present invention is the multilayer electronic component, wherein a direction in which said slots draw is orthogonal to the direction in which said inductor electrodes draw.

A still yet additional aspect of the present invention is the multilayer electronic component, wherein said inductor electrodes have a spiral shape.

A supplementary aspect of the present invention is the multilayer electronic component, wherein said inductor electrodes have a meander shape.

A still supplementary aspect of the present invention is the multilayer electronic component, wherein an inductor comprised of all or part of said inductor electrodes placed not to be sandwiched by said plurality of grounded electrodes is used as a choke coil.

A yet supplementary aspect of the present invention is the multilayer electronic component, wherein an inductor comprised of part of said inductor electrodes not to be sandwiched by said plurality of grounded electrodes is used in a low-pass filter, and the inductor comprised of the inductor electrodes other than said part thereof is used in a high-pass filter.

A still yet supplementary aspect of the present invention is the multilayer electronic component, wherein an inductor comprised of part of said inductor electrodes not to be sandwiched by said plurality of grounded electrodes is used in a band pass filter, and the inductor comprised of the inductor electrodes other than said part thereof is used in a high-pass filter.

Another aspect of the present invention is the multilayer electronic component, wherein an inductor comprised of part of said inductor electrodes not to be sandwiched by said plurality of grounded electrodes is used in a low-pass filter, and the inductor comprised of the inductor electrodes other than said part thereof is used in a band pass filter.

Still yet another aspect of the present invention is the multilayer electronic component, wherein first inductor comprised of part of said inductor electrodes not to be sandwiched by said plurality of grounded electrodes is used in a band pass filter, and the inductor comprised of the inductor electrodes other than said part thereof is used in a band pass filter of a frequency band higher than the band pass filter using the inductor formed by said first inductor electrodes.

Yet still another aspect of the present invention is the multilayer electronic component, wherein an inductor comprised of part of said inductor electrodes not to be sandwiched by said plurality of grounded electrodes is used in a GSM circuit, and the inductor comprised of the inductor electrodes other than said part thereof is used in a DCS circuit.

Still yet another aspect of the present invention is the multilayer electronic component, wherein an inductor comprised of part of said inductor electrodes not to be sandwiched by said plurality of grounded electrodes is used in an AMPS circuit, and the inductor comprised of the inductor electrodes other than said part thereof is used in a CDMA2000 circuit.

A further aspect of the present invention is the multilayer electronic component, wherein an inductor comprised of part of said inductor electrodes not to be sandwiched by said plurality of grounded electrodes is used in a PDC circuit, and the inductor comprised of the inductor electrodes other than said part thereof is used in a W-CDMA circuit.

A still further aspect of the present invention is the multilayer electronic component, wherein an inductor comprised of part of said inductor electrodes not to be sandwiched by said plurality of grounded electrodes is used in a GSM circuit, and the inductor comprised of the inductor electrodes other than said part thereof is used in a W-CDMA circuit.

A yet further aspect of the present invention is the multilayer electronic component, wherein an inductor comprised of part of said inductor electrodes not to be sandwiched by said plurality of grounded electrodes is used in a DCS circuit, and the inductor comprised of the inductor electrodes other than said part thereof is used in a W-CDMA circuit.

A still yet further aspect of the present invention is a communication apparatus having:
reception means of receiving a signal from an antenna, having at least a low noise amplifier, a filter and a mixer;
transmission means of transmitting the signal from said antenna, having at least a mixer, a filter and a power amplifier;
an antenna switch for switching a connection between said antenna and said reception means or said transmission means, whereas:
the multilayer electronic component is used in all or part of the filter of said transmission means, the filter of said reception means, and said antenna switch.

An example of the multilayer electronic component of the present invention as above has the configuration wherein the grounded electrodes on one side of the inductor electrode are eliminated.

Another example thereof has the configuration wherein the via holes from the grounded electrode or the grounded electrodes are provided among a plurality of the inductor electrodes that are close.

In addition, a further example thereof has the configuration wherein the grounded electrodes close to the inductor electrodes have the slots perpendicular to the inductor electrodes.

Figure 1:
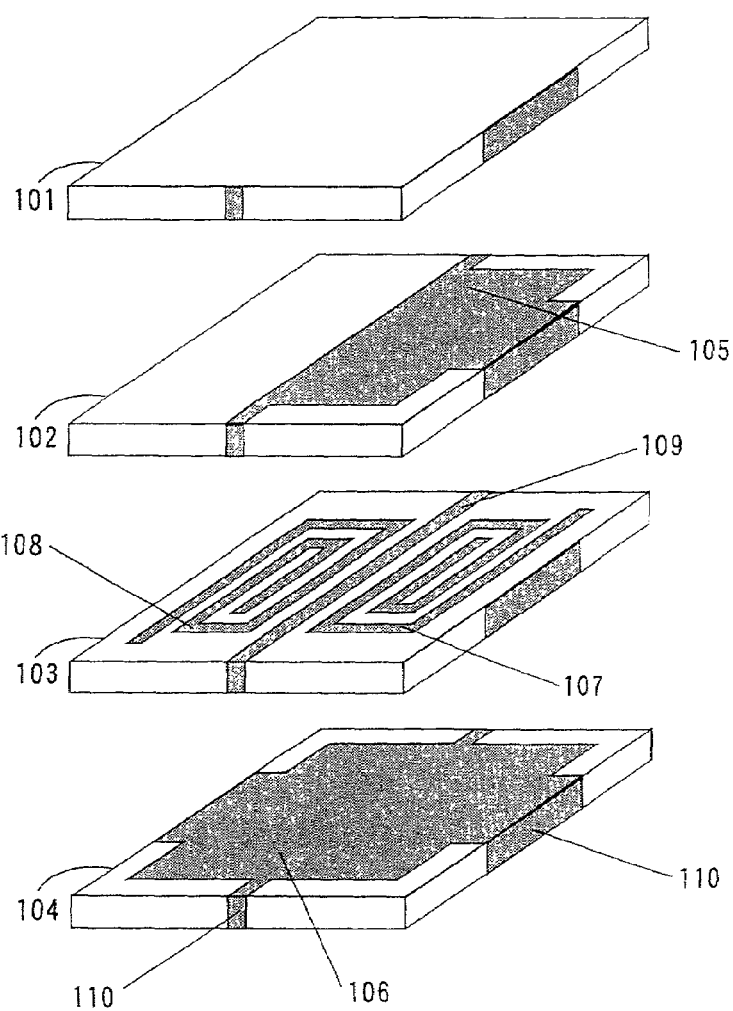
FIG. 1 is a diagram of an internal configuration of a multilayer electronic component in the first embodiment of the present invention.

DESCRIPTION OF SYMBOLS 101 to 104 . . . Dielectric layers
105, 106 . . . Grounded electrodes
107, 108 . . . Inductor electrodes
109 . . . Grounded electrode
110 . . . Side electrode
201 . . . Band pass filter
202 . . . High-pass filter
203 . . . Choke coil
204 . . . Bypass condenser
205 . . . Varactor diode
206 . . . Condenser
207 . . . Resonator
208 . . . Applied voltage port
209 . . . Coupling condenser
210 . . . Coupling condenser
211 . . . Parallel condenser
401 to 405 . . . Dielectric layers
406, 407 . . . Grounded electrode
408, 409 . . . Inductor electrodes
410 . . . Side electrode
501 . . . First low-pass filter
502 . . . High-pass filter
503 . . . Second low-pass filter
504 . . . Third low-pass filter
505 . . . Antenna terminal
506 . . . GSM transmitting terminal
507 . . . GSM receiving terminal
508 . . . DCS transmitting terminal
509 . . . DCS receiving terminal
510 . . . Control terminal
511 . . . Control terminal
512 . . . GSM transmitting circuit
513 . . . GSM receiving circuit
514 . . . DCS transmitting circuit
515 . . . DCS receiving circuit
516 . . . GSM circuit
517 . . . DCS circuit
601 to 604 . . . Dielectric layers
605 . . . Inductor electrode
606, 607 . . . Grounded electrodes
608 . . . Slot
609 . . . Side electrode
701 . . . Choke coil
702 . . . Bypass condenser
703 . . . Varactor diode
704 . . . Condenser
705 . . . Resonator
706 . . . Applied voltage port
900 . . . Ideal transformer
1000 . . . Inductance
1101 . . . Inductor electrode
1102 . . . Slot
1201 . . . Slot
1301 to 1304 . . . Dielectric layers
1305 . . . Grounded electrode
1306 and 1307 . . . Inductor electrodes
1308 . . . Grounded electrode
1309 . . . Exterior inductor
1310 . . . Side electrode
1400 . . . Dielectric layer
1401, 1402 and 1403 . . . Inductor electrodes

PREFERRED EMBODIMENTS OF THE INVENTION

Hereafter, the embodiments of the present invention will be described by referring to the drawings.

First Embodiment

FIG. 1 is a diagram showing an internal configuration of a multilayer electronic component according to the first embodiment of the present invention. In FIG. 1, reference numerals 101 to 104 denote dielectric layers, 105 and 106 denote grounded electrodes, 107 and 108 denote inductor electrodes, and 109 denotes an internal grounded electrode.

In this embodiment, a layered ceramic product to be a body of the multilayer electronic component has, as an example, the dielectric layers 101 to 104 comprised of a crystal phase composed of $Mg_2SiO_4$ and a glass phase composed of an Si—Ba—La—B—O system of which dielectric constant is 7.2 laminated, and the dielectric layer 103 has the inductor electrodes 107 and 108 provided on its principal plane, and furthermore, the internal grounded electrode 109 is placed between the inductor electrodes 107 and 108. In addition, the dielectric layer 104 has the grounded electrodes 106 placed nearly on its entire surface, and the dielectric layer 102 has the grounded electrode 105 placed so as not to overlap a top surface of the inductor electrode 108 on its principal plane, where the grounded electrode 105, the grounded electrodes 106 and the internal grounded electrode 109 are connected by a side electrode 110.

Figure 2:
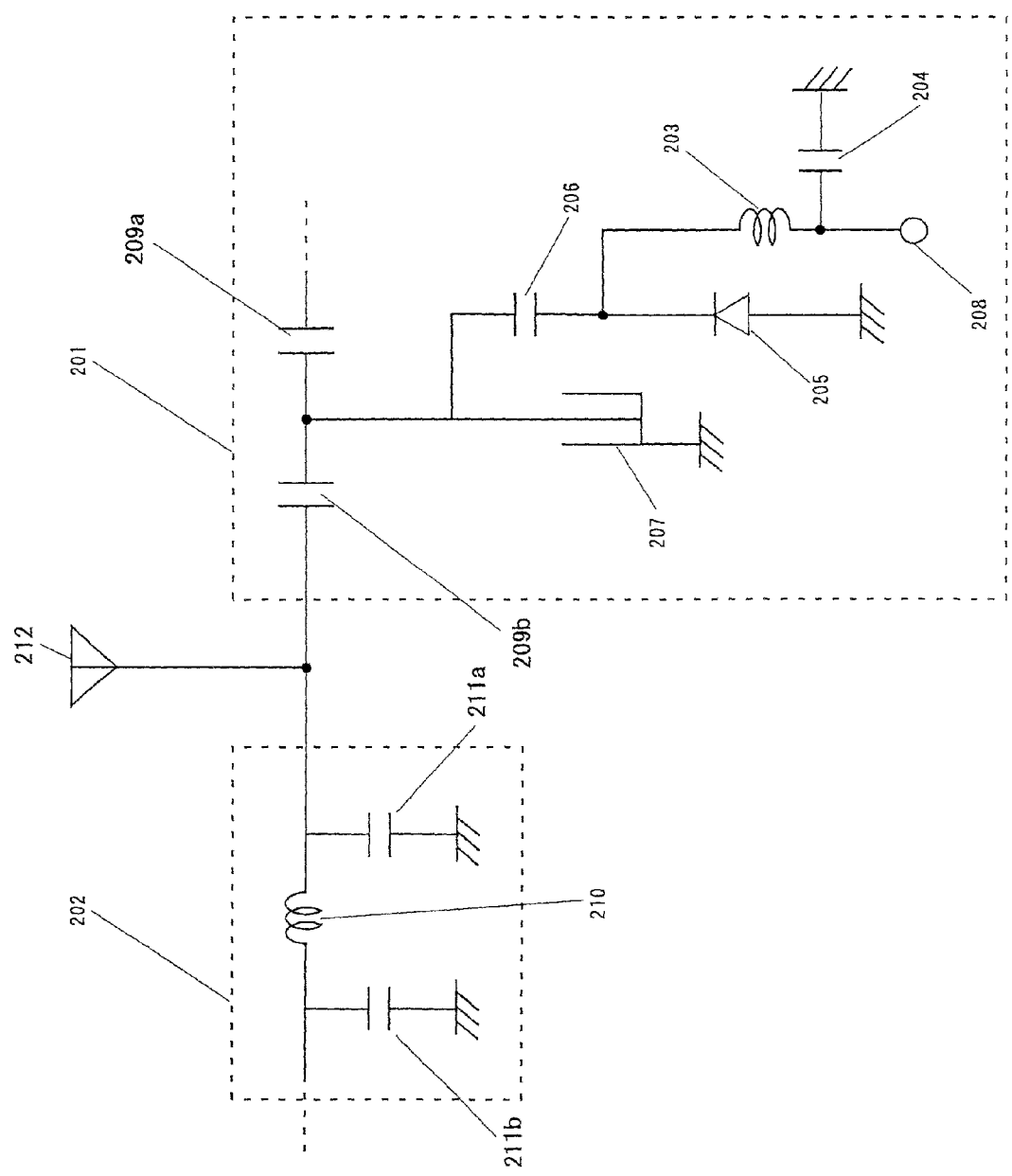
FIG. 2 is an equivalent circuit diagram of a divider comprised of a high-pass filter and a band pass filter in the second embodiment of the present invention.

FIG. 2 is an example of the multilayer electronic component using a plurality of multilayered inductors of this embodiment shown in FIG. 1, and is an equivalent circuit diagram of a divider having a low-pass filter and a band pass filter. In FIG. 2, reference numeral 201 denotes a band pass filter division, 202 denotes a low-pass filter division, and 212 denotes an antenna. In addition, in the band pass filter division 201, reference numeral 203 denotes a choke coil, 204 denotes a bypass condenser, 205 denotes a varactor diode, 206 denotes a condenser, 207 denotes a resonator, 208 denotes an applied voltage port, and 209a and 209b denote coupling condensers. Moreover, in the low-pass filter division 202, reference numeral 210 denotes a coupling inductor, and 211a and 211b denote parallel condensers.

The band pass filter division 201 is the band pass filter of a resonance frequency variable configuration wherein a plurality of the coupling condensers 209a and 209b are connected in series, and resonators 207 are connected in parallel from between the coupling condensers 209a and 209b respectively. The choke coil 203 is there in order to block a high-frequency signal, and the bypass condenser 204 is provided to make a short circuit high-frequency-wise so as not to have a high-frequency potential.

The low-pass filter division 202 has coupling inductors 210 placed in series on the coupling condensers 209a and 209b, and the parallel condensers 211a and 211b are connected in parallel from both ends thereof respectively.

Operations of the multilayer electronic component of this embodiment configured as above will be described.

In the multilayer electronic component shown in FIG. 1, the inductor electrodes 107 and 108 formed as line electrodes in a multilayer spiral state have an impedance as the inductor determined by factors such as their line width, line width space, electrode conductivity, space to the grounded electrodes 105 or 106, the dielectric constants of the dielectric layer 102 and 103 and so on.

On the other hand, in the divider shown in FIG. 2, it is possible to change the resonance frequency of the resonators 207 since a voltage applied to the varactor diode 205 is changed by the voltage given from the applied voltage port 208 resulting in change in capacity applied to the resonators 207.

Here, it is represented that the inductor electrode 108 in FIG. 1 operates as the choke coil 203 in FIG. 2 and the inductor electrode 107 operates as the coupling inductor 210.

As the choke coil 203 is means of blocking the high-frequency signal, it requires a higher impedance than the inductors comprising an RF circuit such as a filter.

Thus, the inductor electrode 108 for the choke coil 203 is only opposite the grounded electrodes 106 provided to the dielectric layer 104 that is a bottom surface thereof. To be more specific, no grounded electrode is provided on the surface opposite the inductor electrode 108 in the dielectric layers 101 and 102, that is, the top surface of the inductor electrode 108 so that the inductor electrode 108 is not sandwiched between the two grounded electrodes. Therefore, the inductor electrode 108 is placed farther from at least one of the two grounded electrodes, and so it can obtain the higher impedance than the inductor electrodes placed to be completely sandwiched between the grounded electrodes.

In addition, the inductor electrode 107 for the coupling inductors 210 has the grounded electrodes 105 and 106 provided to both the dielectric layers 104 and 102 that are the top and bottom surfaces thereof so as to be sandwiched between and close to the two grounded electrodes. Thus, it acquires high isolation.

Figure 15:
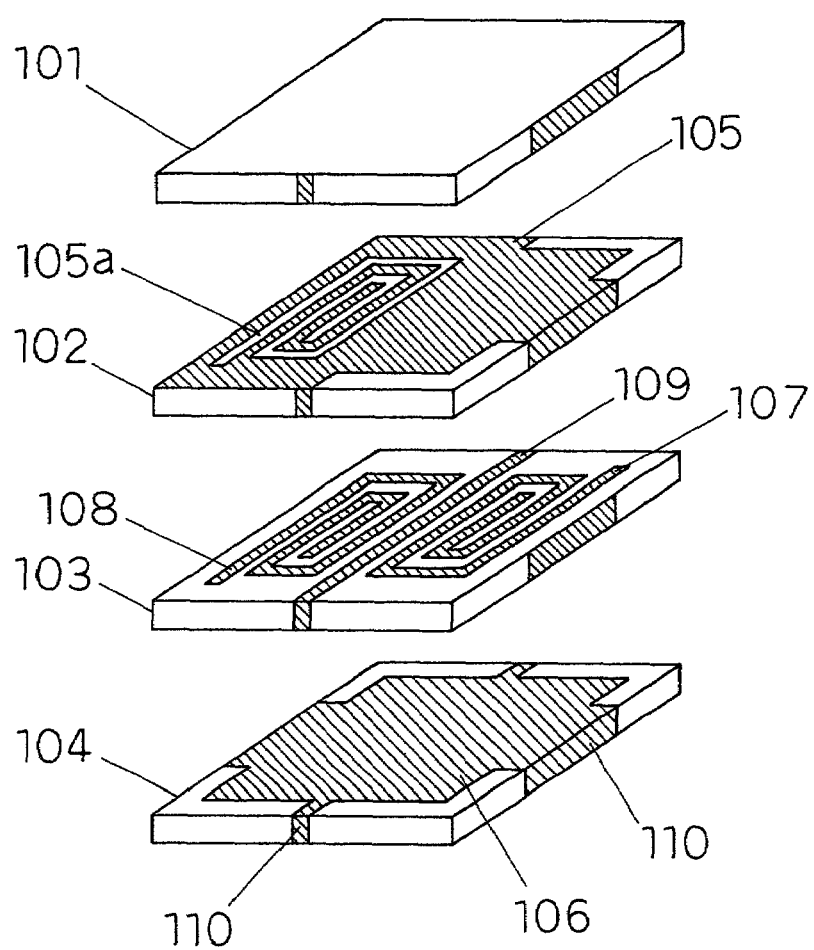
FIG. 15 is a diagram showing another configuration example of the multilayer electronic component in the first embodiment of the present invention.

Here, in the multilayer electronic component in FIG. 1, while no grounded electrode is provided to the portion in the dielectric layer 102 opposite the portion in which the inductor electrode 108 of the dielectric layer 103 is placed so as to implement the configuration wherein the inductor electrode 108 is not sandwiched between the two grounded electrodes, it may also be the configuration wherein the grounded electrodes are placed nearly on the entire surface of the dielectric layer 102 as shown in FIG. 15. At this time, the electrode layer 105 provided to the dielectric layer 102 has a slot 105a opened. The slot 105a has substantially the same shape as the inductor electrode 108, and while the inductor electrode 108 is opposite the slot 105a in the multilayer electronic component, no metal portion of the grounded electrode 105 is opposite the inductor electrode 108. Accordingly, like the example shown in FIG. 1, the inductor electrode 108 is placed not to be sandwiched between the two grounded electrodes, and so it can obtain the higher impedance than the inductor electrodes placed to be sandwiched between the grounded electrodes.

Next, to miniaturize such a multilayer electronic component, it is necessary to place such a plurality of inductors on the same dielectric layer or a close layer.

If the plurality of inductor electrodes are placed on the same dielectric layer or close, however, there is a possibility that the circuit may not sufficiently operate due to the coupling between the inductor electrodes themselves.

Thus, in this embodiment, the internal grounded electrode 109 is placed between the inductor electrodes 107 and 108 and both ends thereof are connected by the side electrode 110. It is thereby possible to suppress mutual coupling between the inductor electrodes 107 and 108. However, the configuration eliminating the internal grounded electrode 109 also belongs to this embodiment although it is not shown. In addition, the configuration wherein the grounded electrodes 105 are placed nearly on the entire surface of the dielectric layer 102, both the inductor electrodes 107 and 108 are sandwiched between the grounded electrodes, and the internal grounded electrode 109 is placed on the same dielectric sheet as the inductor electrodes 107 and 108 also belongs to this embodiment.

Moreover, in FIG. 1, while the internal grounded electrode 109, the grounded electrode 105 and the grounded electrodes 106 are connected by a side electrode 110, it is possible to obtain the same effect by providing a plurality of via holes between the inductor electrodes 107 and 108 and connecting the grounded electrode 105 and the grounded electrodes 106 by these via holes.

In addition, while the above was described on the assumption that the multilayer electronic component of this embodiment is used in the divider having the low-pass filter and the band pass filter, it may also be used in the divider having a low-pass filter and the high-pass filter.

In this case, it is desirable to use the inductor formed by the inductor electrode 107 for the high-pass filter and use the inductor of a high impedance formed by the inductor electrode 108 for the low-pass filter. It is because, as the low-pass filter has a lower passing band of the signal, the inductor in the low-pass filter needs to be one having a higher impedance than the one in the high-pass filter. Thus, it is possible to implement the multilayer electronic component having the inductor of an optimum impedance.

Moreover, it may also be used in the divider having the band pass filter and the high-pass filter.

In this case, it is desirable to use the inductor formed by the inductor electrode 107 for the high-pass filter and use the inductor of the high impedance formed by the inductor electrode 108 for the band pass filter having the passing band lower than the high-pass filter. It is because the inductor in the band pass filter needs to be one having the higher impedance than the one in the high-pass filter. Thus, it is possible to implement the multilayer electronic component having the inductor of the optimum impedance.

In addition, it may also be used in the divider having the low-pass filter and the band pass filter.

In this case, it is desirable to use the inductor formed by the inductor electrode 107 for the band pass filter and use the inductor of the high impedance formed by the inductor electrode 108 for the low-pass filter. It is because, as the low-pass filter has the lower passing band, the inductor in the low-pass filter needs to be one having a higher impedance than the one in the band pass filter. Thus, it is possible to implement the multilayer electronic component having the inductor of the optimum impedance.

Furthermore, it may also be used in the divider having two band pass filters of mutually different frequency bands.

In this case, it is desirable to use the inductor formed by the inductor electrode 107 for one of the band pass filters and use the inductor of the higher impedance formed by the inductor electrode 108 for the band pass filter having the passing band lower than the other band pass filter. It is because the inductor in the band pass filter on the low-frequency side needs to be one having a higher impedance than the one in the band pass filter on the high-frequency side. Thus, it is possible to implement the multilayer electronic component having the inductor of the optimum impedance.

Figure 5:
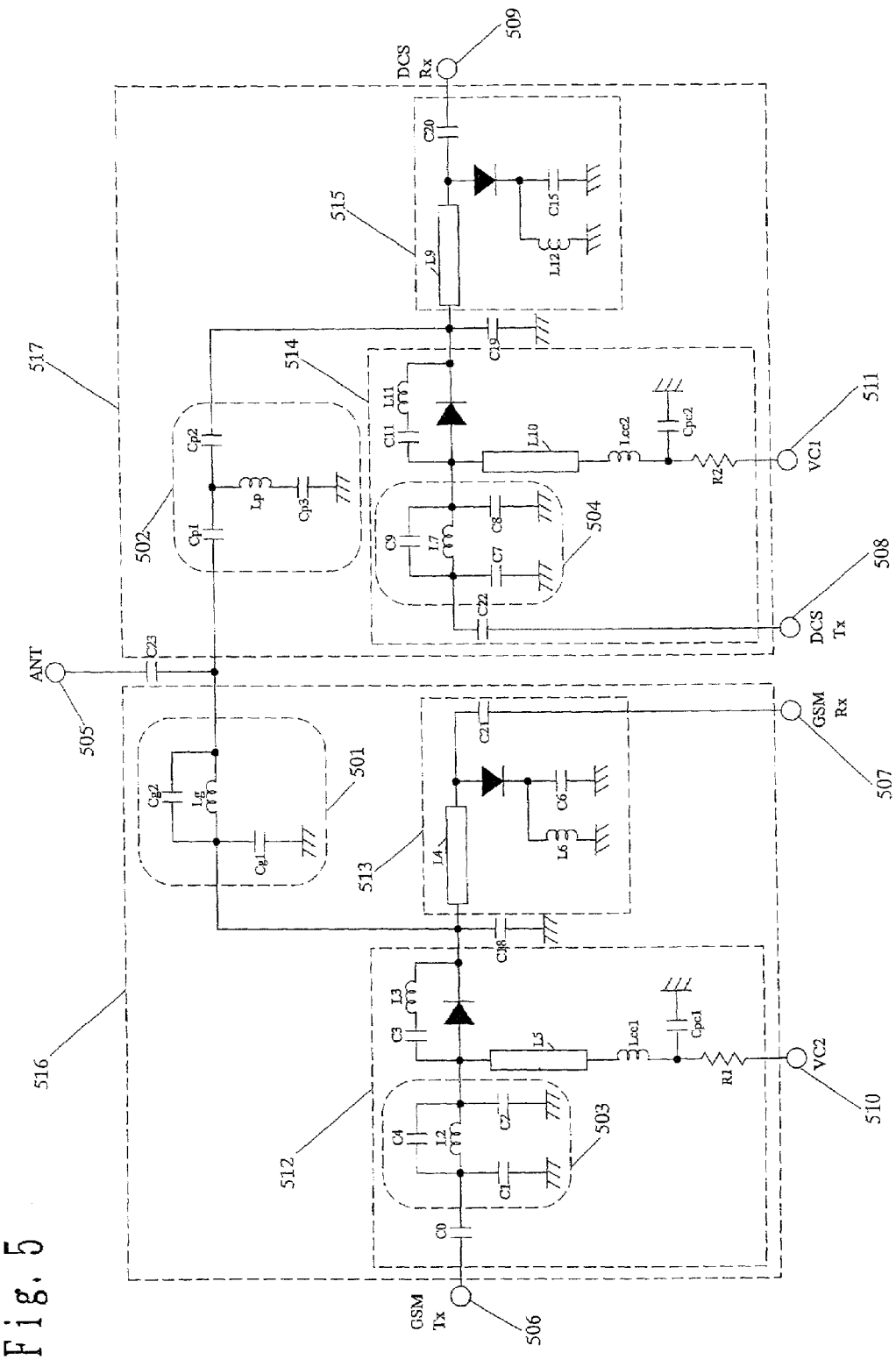
FIG. 5 is the equivalent circuit diagram of the multilayer electronic component in the second embodiment of the present invention.

In addition, it is also feasible to use it in the divider having the circuit on a DCS side and the circuit on a GSM side. Here, FIG. 5 is an example of the multilayer electronic component using a plurality of multilayered inductors of this embodiment shown in FIG. 1, and is the equivalent circuit diagram of a divider having the GSM circuit and the DCS circuit. In FIG. 5, reference numeral 516 denotes the GSM circuit, 517 denotes the DCS circuit, and 505 denotes an antenna terminal. In addition, in the GSM circuit 516, reference numeral 501 denotes the first low-pass filter, 503 denotes the second low-pass filter, 512 denotes a GSM transmitting circuit, 513 denotes a GSM receiving circuit, 506 denotes a GSM transmitting terminal, 507 denotes a GSM receiving terminal, and 510 denotes a control terminal. Moreover, in the DCS circuit 517, reference numeral 502 denotes the high-pass filter, 504 denotes the third low-pass filter, 508 denotes a DCS transmitting terminal, 509 denotes a DCS receiving terminal, 511 denotes the control terminal, 514 denotes a DCS transmitting circuit, and 515 denotes a DCS receiving circuit.

Figure 16:
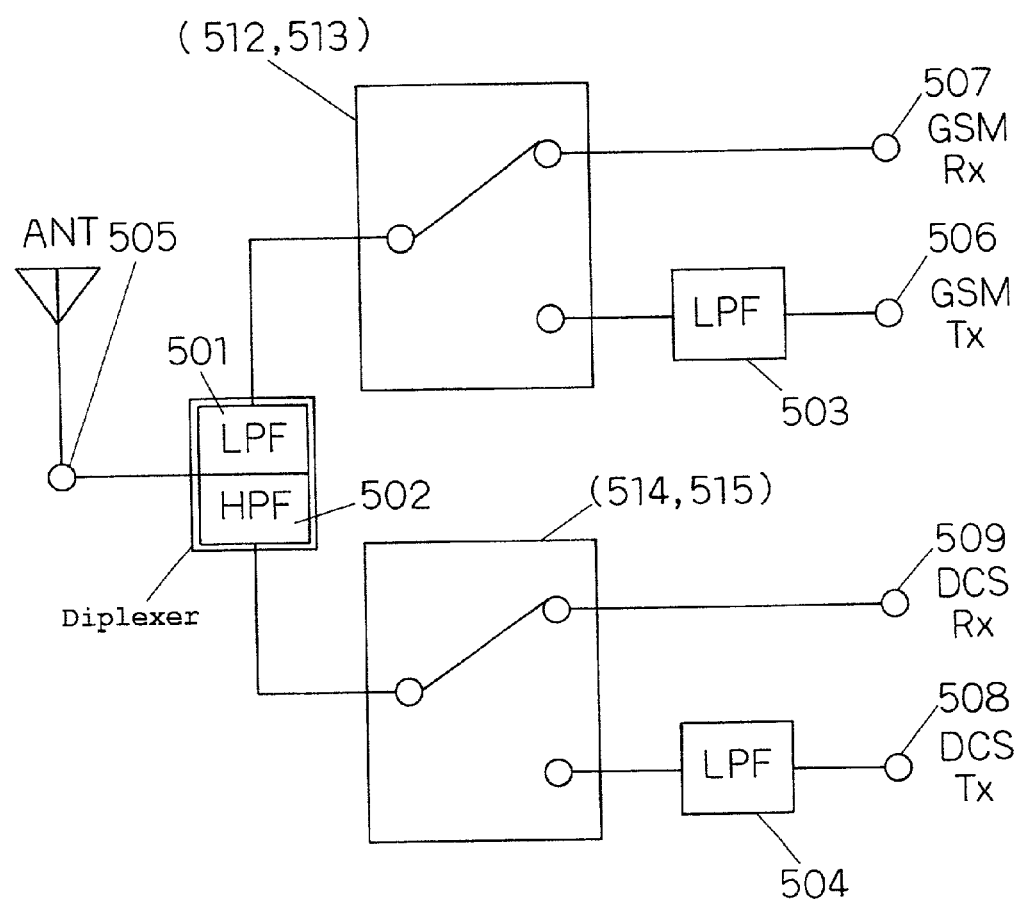
FIG. 16 is a block diagram of the multilayer electronic component in the second embodiment of the present invention.

Moreover, FIG. 16 is a block diagram of the divider shown in FIG. 5, and the portions corresponding to FIG. 5 are numbered likewise in the diagram and detailed description thereof is omitted. In addition, the GSM circuit includes the GSM transmitting circuit 512 and the GSM receiving circuit 513, and the switching circuit on the DCS side includes the DCS transmitting circuit 514 and the DCS receiving circuit 515.

Such a divider operates as follows. The signals inputted from the antenna terminal 505 are divided between the GSM circuit 516 and the DCS circuit 517 by the first low-pass filter 501 and the high-pass filter 502. On the GSM circuit, it is selected which of the GSM transmitting circuit 512 and the GSM receiving circuit 513 is to be operated by the applied voltage of the control terminal 510. Likewise, it is selected which of the DCS transmitting circuit 514 and the DCS receiving circuit 515 is to be operated by the applied voltage of the control terminal 511.

At this time, the inductor Lg in the first low-pass filter 501 requires the higher impedance than the inductor Lp in the high-pass filter 502.

Thus, the inductor electrode 108 of this embodiment shown in FIGS. 1 and 15 should be used as the inductor Lg configured in the first low-pass filter 501, and the inductor electrode 107 should be used as the inductor Lp configured in the high-pass filter 502.

It is also feasible to use the inductor electrode 107 as an inductor L12 configured in the DCS receiving circuit 515 and use the inductor electrode 108 as an inductor L6 configured in the GSM receiving circuit 513.

Moreover, it is also feasible to use the inductor electrode 107 as an inductor L11 configured in the DCS transmitting circuit 514 and use the inductor electrode 108 as an inductor L3 configured in the GSM transmitting circuit 512.

Furthermore, it is also feasible to use the inductor electrode 107 as an inductor L7 configured in the third low-pass filter 504 and use the inductor electrode 108 as an inductor L2 configured in the second low-pass filter 503.

Figure 3:
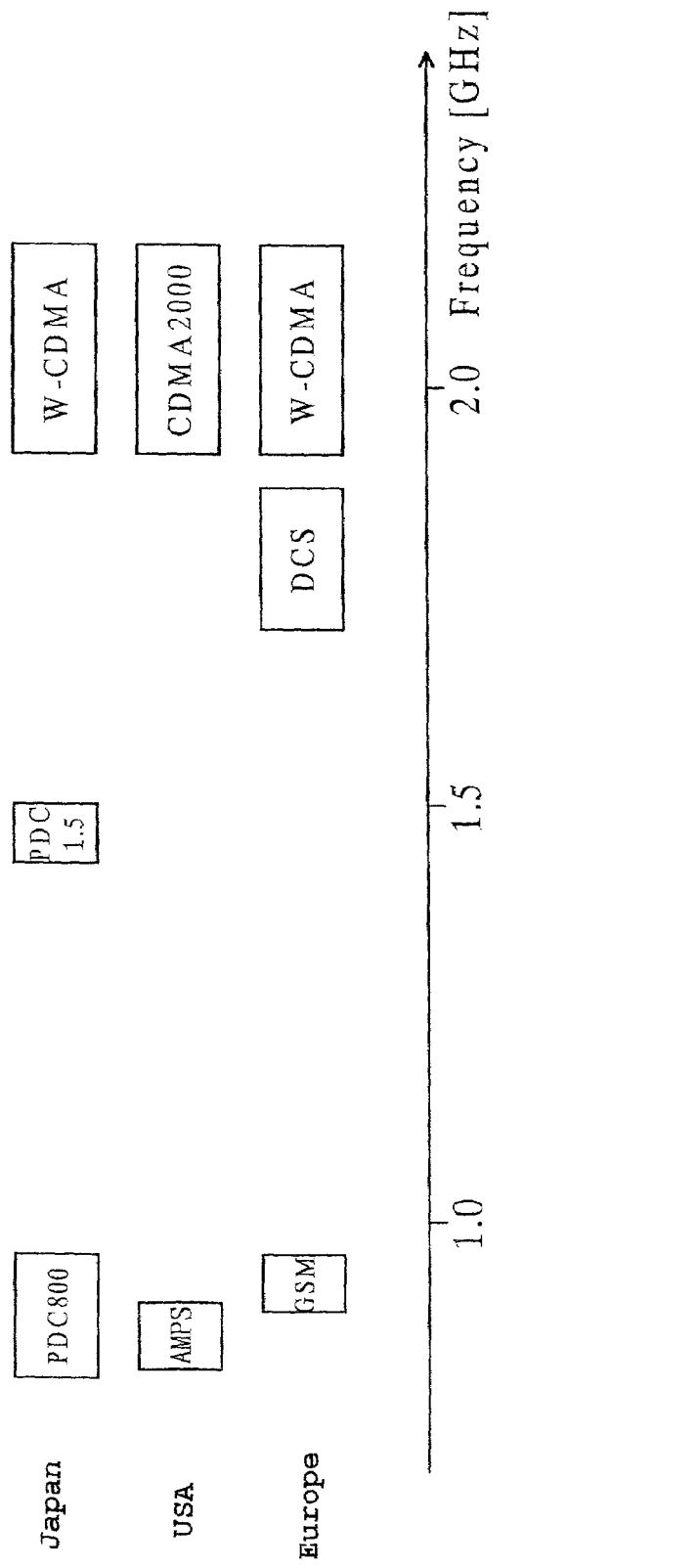
FIG. 3 is a diagram of a frequency band of a portable telephone system in each area.

To put it briefly, it is desirable to use the inductor formed by the inductor electrode 107 on the circuit on the DCS side, and use the inductor of the high impedance formed by the inductor electrode 108 on the circuit on the GSM side. It is because, as the circuit on the GSM side has the lower passing band as shown in FIG. 3, the inductor on the circuit on the GSM side needs to be one having a higher impedance than the one on the circuit on the DCS side.

Furthermore, on the DCS circuit 517, it is also feasible to use the inductor electrode 107 as all or part of the inductor Lp configured in the high-pass filter 502, the inductor L7 configured in the third low-pass filter 504 and the inductor L12 configured in the DCS receiving circuit 515, and use the inductor electrode 108 as an inductor Lcc2 configured in the DCS transmitting circuit 514.

Moreover, on the GSM circuit 516, it is also feasible to use the inductor electrode 107 as all or part of the inductor Lg configured in the first low-pass filter 501, the inductor L2 configured in the second low-pass filter 503 and the inductor L6 configured in the GSM receiving circuit 513, and use the inductor electrode 108 as an inductor Lcc1 configured in the GSM transmitting circuit 512.

To put it briefly, it is desirable to use the inductor formed by the inductor electrode 107 on the circuit including an ordinary inductor and use the inductor of the high impedance formed by the inductor electrode 108 on the circuit including the choke coil.

It is because, as the choke coils Lcc1 and Lcc2 are the means of blocking the high-frequency signal just as in the case of the divider in FIG. 2, they require the higher impedance than the inductors comprising the RF circuit such as the filter.

Thus, it is possible to implement the multilayer electronic component having the inductor of the optimum impedance.

In addition, it is also feasible to use it in the divider having the circuit on a CDMA2000 side and the circuit on an AMPS side.

In this case, it is desirable to use the inductor formed by the inductor electrode 107 on the circuit on the CDMA2000 side and use the inductor of the high impedance formed by the inductor electrode 108 on the circuit on an AMPS side. It is because, as the circuit on the AMPS side has the lower passing band as shown in FIG. 3, the inductor on the circuit on the AMPS side needs to be one having the higher impedance than the one on the circuit on the CDMA2000 side. Thus, it is possible to implement the multilayer electronic component having the inductor of the optimum impedance.

Moreover, it is also feasible to use it in the divider having the circuit on a W-CDMA side and the circuit on a PDC side. In this case, it is desirable to use the inductor formed by the inductor electrode 107 on the circuit on the W-CDMA side and use the inductor of the high impedance formed by the inductor electrode 108 on the circuit on the PDC side. It is because, as the circuit on the PDC side has the lower passing band as shown in FIG. 3, the inductor on the circuit on the PDC side needs to be one having the higher impedance than the one on the circuit on the W-CDMA side. Thus, it is possible to implement the multilayer electronic component having the inductor of the optimum impedance.

In addition, it is also feasible to use it in the divider having the circuit on the W-CDMA side and the circuit on the GSM side. In this case, it is desirable to use the inductor formed by the inductor electrode 107 on the circuit on the W-CDMA side and use the inductor of the high impedance formed by the inductor electrode 108 on the circuit on the GSM side. It is because, as the circuit on the GSM side has the lower passing band as shown in FIG. 3, the inductor on the circuit on the GSM side needs to be one having the higher impedance than the one on the circuit on the W-CDMA side. Thus, it is possible to implement the multilayer electronic component having the inductor of the optimum impedance.

Moreover, it is also feasible to use it in the divider having the circuit on the W-CDMA side and the circuit on the DCS side. In this case, it is desirable to use the inductor formed by the inductor electrode 107 on the circuit on the W-CDMA side and use the inductor of the high impedance formed by the inductor electrode 108 on the circuit on the DCS side. It is because, as the circuit on the DCS side has the lower passing band as shown in FIG. 3, the inductor on the circuit on the DCS side needs to be one having the higher impedance than the one on the circuit on the W-CDMA side. Thus, it is possible to implement the multilayer electronic component having the inductor of the optimum impedance.

Second Embodiment

Next, the second embodiment of the present invention will be described. However, the points in common with the first embodiment will be omitted, and the different points will be described.

Figure 4:
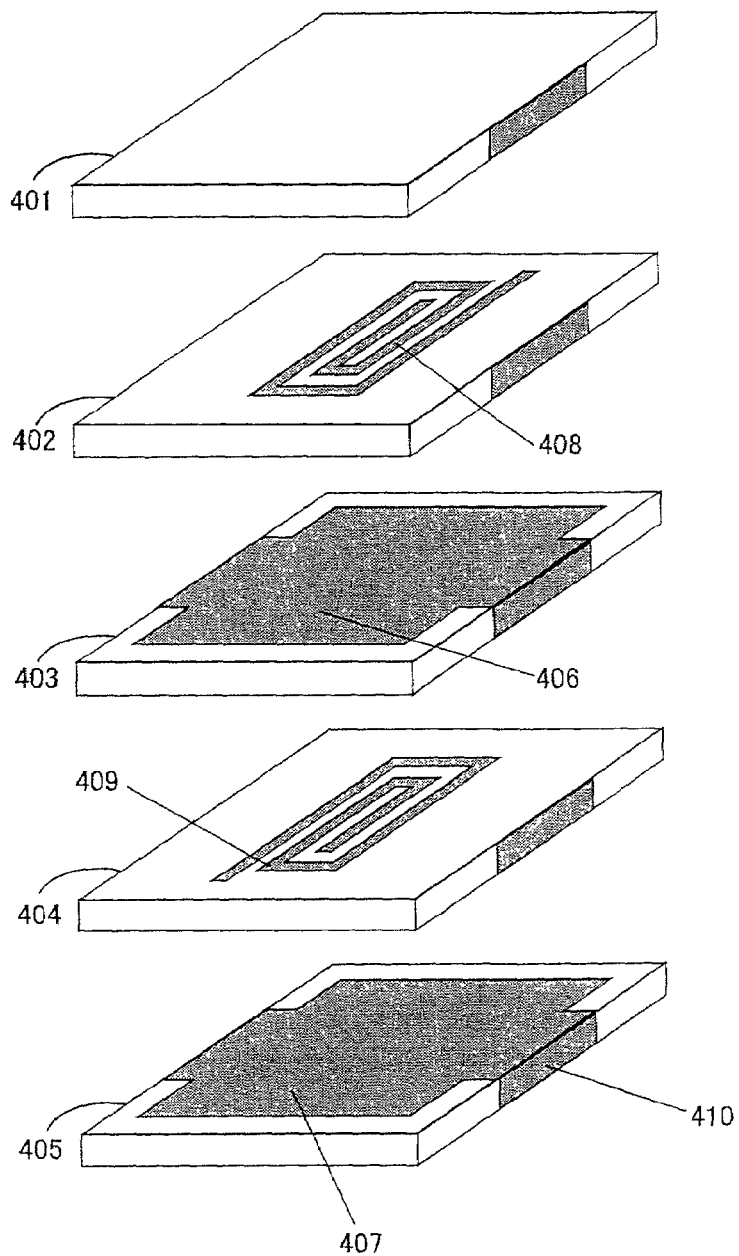
FIG. 4 is a diagram of the internal configuration of the multilayer electronic component in the second embodiment of the present invention.

FIG. 4 is a diagram showing the internal configuration of the multilayer electronic component according to the second embodiment of the present invention. In FIG. 4, reference numerals 401 to 405 denote the dielectric layers, 406 and 407 denote the grounded electrodes, and 408 and 409 denote the inductor electrodes.

In this embodiment, the layered ceramic product to be the body of the multilayer electronic component has, as an example, the dielectric layers 401 to 405 comprised of the crystal phase composed of $Mg_2SiO_4$ and a glass phase composed of an Si—Ba—La—B—O system of which dielectric constant is 7.2 laminated, and the dielectric layer 402 has the inductor electrode 408 and the dielectric layer 404 has the inductor electrode 409 provided on their respective principal planes. In addition, the dielectric layers 403 and 405 have the grounded electrodes 406 and 407 placed nearly on their entire surfaces, and the grounded electrodes 406 and 407 are connected by a side electrode 410.

FIG. 5 is an example of the multilayer electronic component using a plurality of the multilayered inductors of this embodiment shown in FIG. 4, and is the equivalent circuit diagram of a divider having the GSM circuit and the DCS circuit. In FIG. 5, reference numeral 516 denotes the GSM circuit, 517 denotes the DCS circuit, and 505 denotes the antenna terminal. In addition, on the GSM circuit 516, reference numeral 501 denotes the first low-pass filter, 503 denotes the second low-pass filter, 512 denotes the GSM transmitting circuit, 513 denotes the GSM receiving circuit, 506 denotes the GSM transmitting terminal, 507 denotes the GSM receiving terminal, and 510 denotes the control terminal. In addition, on the DCS circuit 517, reference numeral 502 denotes the high-pass filter, 504 denotes the third low-pass filter, 508 denotes the DCS transmitting terminal, 509 denotes the DCS receiving terminal, 511 denotes the control terminal, 514 denotes the DCS transmitting circuit, and 515 denotes the DCS receiving circuit.

Operations of the multilayer electronic component according to this embodiment configured as above will be described.

In the multilayer electronic component shown in FIG. 4, the inductor electrodes 408 and 409 formed as the line electrodes in a multilayer spiral state have the impedance as the multilayer electronic component determined by the factors such as their line width, line width space, electrode conductivity, space to the grounded electrodes 406 and 407, the dielectric constants of the dielectric layers 401 to 404 and so on.

At this time, in this embodiment, the inductor electrode 408 is only opposite the grounded electrodes 406 provided to the dielectric layer 403 that is the bottom surface thereof. To be more specific, no grounded electrode is provided to the dielectric layer 401 that is close to the top surface of the inductor electrode 408 so that the inductor electrode 408 is not sandwiched between the two grounded electrodes.

Thus, the inductor electrode 408 is placed farther from at least one of the two grounded electrodes, and so it can obtain the higher impedance than the inductor electrodes placed to be sandwiched between the grounded electrodes.

In addition, the inductor electrode 409 has the grounded electrodes 406 and 407 provided to both the dielectric layers 403 and 105 that are the top and bottom surfaces thereof so as to be sandwiched between and close to the two grounded electrodes. Thus, the inductor electrode 409 acquires the high isolation.

Meanwhile, for the sake of miniaturization, it is necessary to place such a plurality of inductors on the same dielectric layer or a close layer.

If the plurality of inductor electrodes are placed on the same dielectric layer or close, however, there is a possibility that the circuit may not sufficiently operate due to the coupling between the inductors themselves.

Thus, in this embodiment, the internal grounded electrode 406 is placed between the inductor electrodes 408 and 409, and the ends thereof are connected to the grounded electrode 407 via the side electrode 410. It is thereby possible to suppress the mutual coupling between the inductor electrodes 408 and 409.

On the other hand, the operation of the divider shown in FIG. 5 is as follows. The signals inputted from the antenna terminal 505 are divided between the GSM circuit 516 and the DCS circuit 517 by the first low-pass filter 501 and the high-pass filter 502. On the GSM circuit, it is selected which of the GSM transmitting circuit 512 and the GSM receiving circuit 513 is to be operated by the applied voltage of the control terminal 510. Likewise, it is selected which of the DCS transmitting circuit 514 and the DCS receiving circuit 515 is to be operated by the applied voltage of the control terminal 511.

At this time, the inductor Lg in the first low-pass filter requires the higher impedance than the inductor Lp in the high-pass filter.

Thus, the inductor electrode 408 in FIG. 4 should operate as the inductor Lg configured in the first low-pass filter, and the inductor electrode 409 should operate as the inductor Lp configured in the high-pass filter.

It is also feasible to use the inductor electrode 409 as the inductor L12 configured in the DCS receiving circuit 515 and use the inductor electrode 408 as the inductor L6 configured in the GSM receiving circuit 513.

Moreover, it is also feasible to use the inductor electrode 409 as the inductor L11 configured in the DCS transmitting circuit 514 and use the inductor electrode 408 as the inductor L3 configured in the GSM transmitting circuit 512.

Furthermore, it is also feasible to use the inductor electrode 409 as the inductor L7 configured in the third low-pass filter 504 and use the inductor electrode 408 as the inductor L2 configured in the second low-pass filter 503.

To put it briefly, it is desirable to use the inductor formed by the inductor electrode 409 on the circuit on the DCS side, and use the inductor of the high impedance formed by the inductor electrode 408 on the circuit on the GSM side. It is because, as the circuit on the GSM side has the lower passing band as shown in FIG. 3, the inductor on the circuit on the GSM side needs to be one having the higher impedance than the one on the circuit on the DCS side.

Furthermore, on the DCS circuit 517, it is also feasible to use the inductor electrode 409 as all or part of the inductor Lp configured in the high-pass filter 502, the inductor L7 configured in the third low-pass filter 504 and the inductor L12 configured in the DCS receiving circuit 515, and use the inductor electrode 408 as an inductor Lcc2 configured in the DCS transmitting circuit 514.

Moreover, on the GSM circuit 516, it is also feasible to use the inductor electrode 409 as all or part of the inductor Lg configured in the first low-pass filter 501, the inductor L2 configured in the second low-pass filter 503 and the inductor L6 configured in the GSM receiving circuit 513, and use the inductor electrode 408 as an inductor Lcc1 configured in the GSM transmitting circuit 512.

To put it briefly, it is desirable to use the inductor formed by the inductor electrode 409 on the circuit including the ordinary inductor and use the inductor of the high impedance formed by the inductor electrode 408 on the circuit including the choke coil.

It is because, as the choke coils Lcc1 and Lcc2 are the means of blocking the high-frequency signal just as in the case of the divider in FIG. 2, they require the higher impedance than the inductors comprising the RF circuit such as the filter.

Thus, it is possible to implement the multilayer electronic component having the inductor of the optimum impedance.

Moreover, while the above was described on the assumption that the multilayer electronic component according to this embodiment is used in the divider having the DCS circuit and the GSM circuit, it may also be used in the divider having the low-pass filter and the band pass filter as described in First Embodiment.

In this case, it is desirable to use the inductor formed by the inductor electrode 409 for the low-pass filter and use the inductor of the high impedance formed by the inductor electrode 408 for the bandpass filter having the lower passing band than the above high-pass filter. It is because the inductor in the band pass filter needs to be one having the higher impedance than the one in the high-pass filter. Thus, it is possible to implement the multilayer electronic component having the inductor of the optimum impedance.

In addition, it may also be used in the divider having the band pass filter and the low-pass filter.

In this case, it is desirable to use the inductor formed by the inductor electrode 409 for the band pass filter and use the inductor of the high impedance formed by the inductor electrode 408 for the low-pass filter. It is because, as the low-pass filter has the lower passing band, the inductor in the low-pass filter needs to be one having the higher impedance than the one in the band pass filter. Thus, it is possible to implement the multilayer electronic component having the inductor of the optimum impedance.

Furthermore, it may also be used in the divider having two band pass filters of mutually different frequency bands.

In this case, it is desirable to use the inductor formed by the inductor electrode 409 for one of the band pass filters and use the inductor of the higher impedance formed by the inductor electrode 408 for the band pass filter having the lower passing band than the other band pass filter. It is because the inductor in the band pass filter on the low-frequency side needs to be one having a higher impedance than the one in the band pass filter on the high-frequency side. Thus, it is possible to implement the multilayer electronic component having the inductor of the optimum impedance.

In addition, it is also feasible to use it in the divider having the circuit on the CDMA2000 side and the circuit on the AMPS side.

In this case, it is desirable to use the inductor formed by the inductor electrode 409 on the circuit on the CDMA2000 side and use the inductor of the higher impedance formed by the inductor electrode 408 on the circuit on the AMPS side. It is because, as the circuit on the AMPS side has the lower passing band as shown in FIG. 3, the inductor on the circuit on the AMPS side needs to be one having the higher impedance than the one on the circuit on the CDMA2000 side. Thus, it is possible to implement the multilayer electronic component having the inductor of the optimum impedance.

Moreover, it is also feasible to use it in the divider having the circuit on the W-CDMA side and the circuit on the PDC side. In this case, it is desirable to use the inductor formed by the inductor electrode 409 on the circuit on the W-CDMA side and use the inductor of the high impedance formed by the inductor electrode 408 on the circuit on the PDC side. It is because, as the circuit on the PDC side has the lower passing band as shown in FIG. 3, the inductor on the circuit on the PDC side needs to be one having the higher impedance than the one on the circuit on the W-CDMA side. Thus, it is possible to implement the multilayer electronic component having the inductor of the optimum impedance.

In addition, it is also feasible to use it in the divider having the circuit on the W-CDMA side and the circuit on the GSM side. In this case, it is desirable to use the inductor formed by the inductor electrode 409 on the circuit on the W-CDMA side and use the inductor of the high impedance formed by the inductor electrode 408 on the circuit on the GSM side. It is because, as the circuit on the GSM side has the lower passing band as shown in FIG. 3, the inductor on the circuit on the GSM side needs to be one having the higher impedance than the one on the circuit on the W-CDMA side. Thus, it is possible to implement the multilayer electronic component having the inductor of the optimum impedance.

Moreover, it is also feasible to use it in the divider having the circuit on the W-CDMA side and the circuit on the DCS side. In this case, it is desirable to use the inductor formed by the inductor electrode 409 on the circuit on the W-CDMA side and use the inductor of the high impedance formed by the inductor electrode 408 on the circuit on the DCS side. It is because, as the circuit on the DCS side has the lower passing band as shown in FIG. 3, the inductor on the circuit on the DCS side needs to be one having the higher impedance than the one on the circuit on the W-CDMA side. Thus, it is possible to implement the multilayer electronic component having the inductor of the optimum impedance.

Third Embodiment

Figure 6:
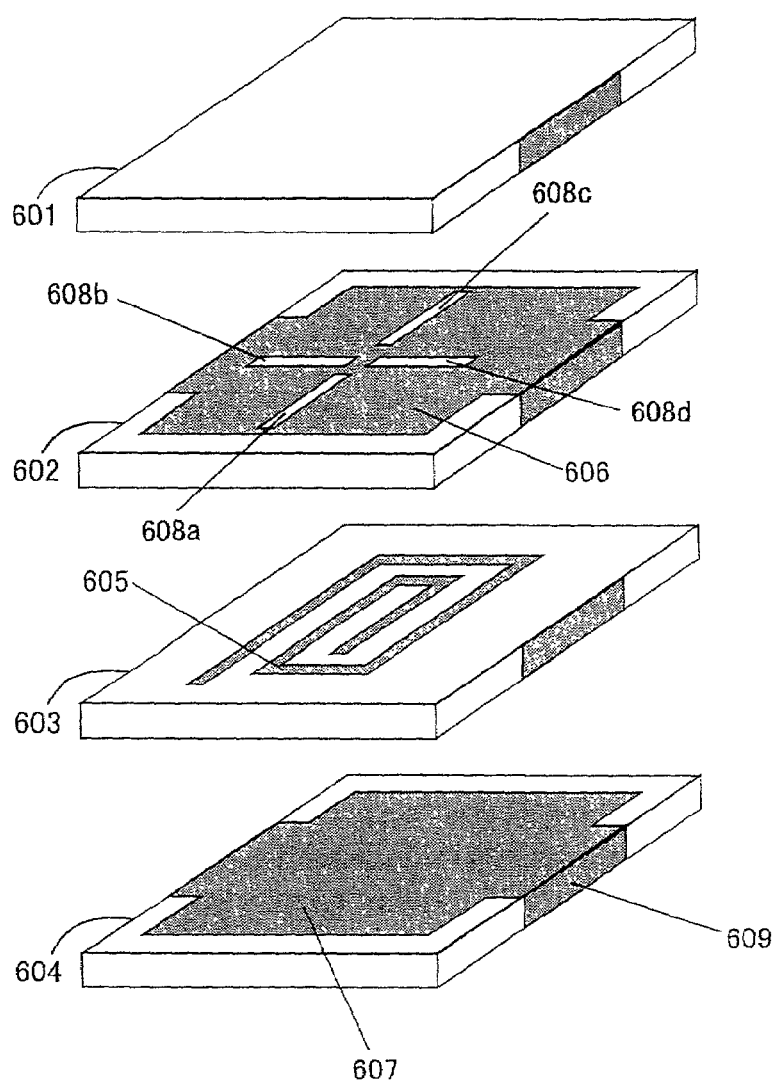
FIG. 6 is a diagram of the internal configuration of the multilayer electronic component in the third embodiment of the present invention.

FIG. 6 shows the internal configuration of the multilayer electronic component according to the third embodiment of the present invention. In FIG. 6, reference numerals 601 to 604 denote the dielectric layers, 605 denotes the inductor electrode, 606 and 607 denote the grounded electrodes, and 608 denotes the slot.

In this embodiment, the layered ceramic product to be the body of the multilayer electronic component has, as an example, the dielectric layers 601 to 604 comprised of the crystal phase composed of $Mg_2SiO_4$ and the glass phase composed of an Si—Ba—La—B—O system of which dielectric constant is 7.2 laminated, and the dielectric layer 603 has the inductor electrode 605 provided thereon. In addition, the dielectric layers 602 and 604 have the grounded electrodes 606 and 607 placed nearly on their entire surfaces, where the grounded electrode 606 has the slots 608*a* to 608*d* opened orthogonally to a drawing direction of the line of the inductor electrode 605 if viewed from the laminated surface of the dielectric, and the grounded electrodes 606 and 607 are connected by a side electrode 609.

Figure 7:
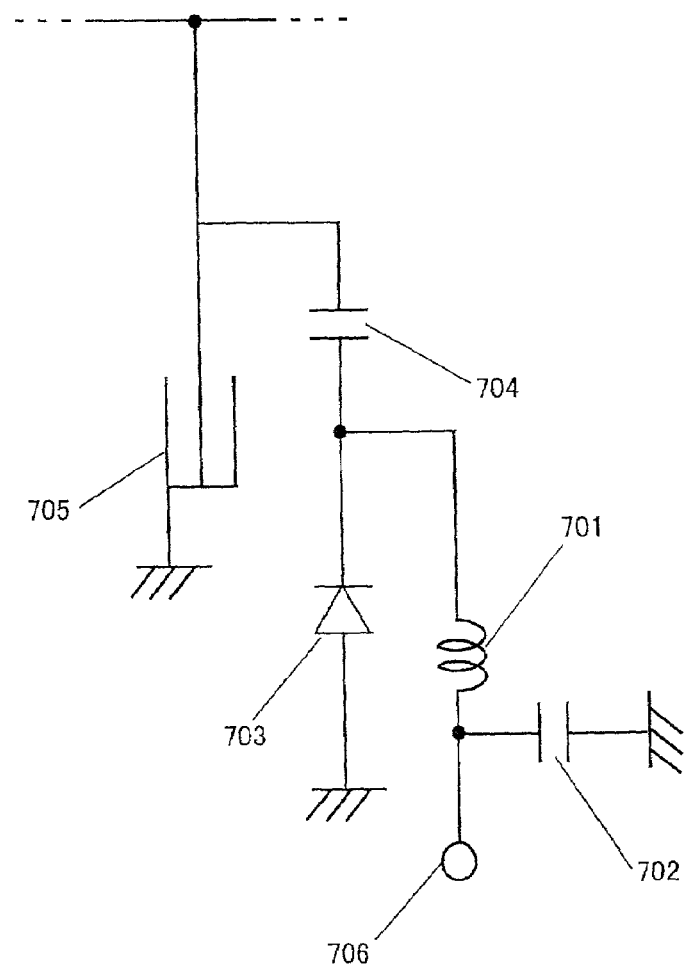
FIG. 7 is the equivalent circuit diagram of the resonance frequency adjusting apparatus in the third embodiment of the present invention.

FIG. 7 is an example of the multilayer electronic component using the multilayered inductors of this embodiment shown in FIG. 6, and is the equivalent circuit diagram of a resonance frequency adjusting apparatus using the multilayer electronic component in FIG. 6 as the inductor in the choke coil. In FIG. 7, reference numeral 701 denotes the choke coil implemented in the inductor electrode 605, 702 denotes the bypass condenser, 703 denotes the varactor diode, 704 denotes the condenser, 705 denotes the resonator, and 706 denotes the applied voltage port. The choke coil 701 is there in order to block the high-frequency signal, and the bypass condenser 702 is provided to make a short circuit high-frequency-wise so as not to have the high-frequency potential.

Figure 8:
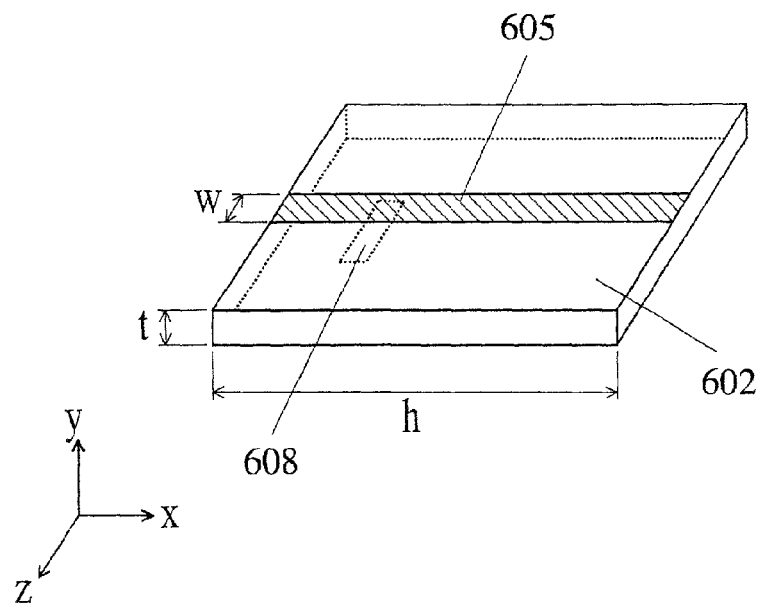
FIG. 8 is a partially enlarged view of the internal configuration of the multilayer electronic component in the third embodiment of the present invention.
Figure 8:
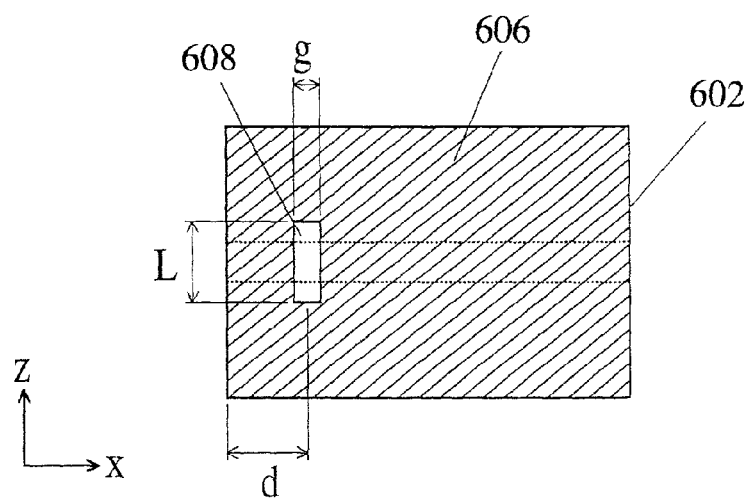

FIG. 8 is an enlarged schematic diagram for describing a positional relationship between one slot 608 opened on the grounded electrode 606 on the dielectric layer 602 and a portion of the inductor electrode 605 of the dielectric layer 603.

Operations of the multilayer electronic component of this embodiment configured as above will be described.

While the slot 608 (any of a, b, c and d) has any electric field existing thereon, the electric field of an Ex component thereof to be one in an X-axis direction in FIGS. 8A and 8B represents a progressive wave (standing wave) on the slot 608.

Figure 9:
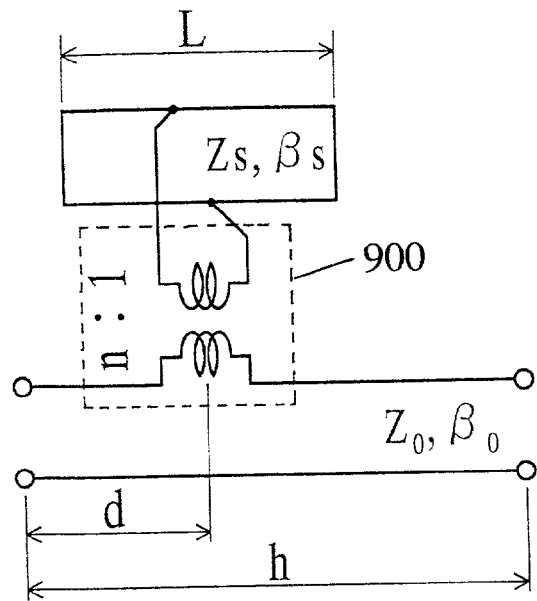
FIG. 9 is the equivalent circuit diagram of a portion of the multilayer electronic component in the third embodiment of the present invention.

Here, FIG. 9 shows a simplified equivalent circuit diagram of a straight-line segment that is a portion of the inductor electrode 605 when the length of the slot 608 is L. In FIG. 9, the equivalent circuit of a crossing portion made by a strip line that is a portion of the inductor electrode 605 and the slot 608 is represented by an ideal transformer 900 of which impedance ratio is n:1. This impedance ratio n is determined by various amounts such as a slot width g, a strip line width w, a thickness t, a slot length L, a dielectric substrate dielectric constant and the frequency due to discontinuity of the above crossing portion.

Figure 10:
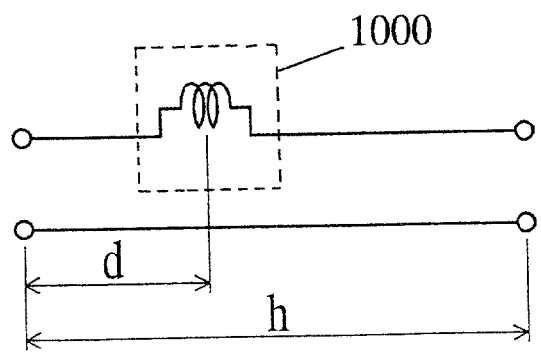
FIG. 10 is the equivalent circuit diagram of a portion of the multilayer electronic component in the third embodiment of the present invention.

Now, if the slot length L is sufficiently smaller than a wavelength of the signal to be inputted, the equivalent circuit of the strip line and the slot of which impedance is multiplied by n by the ideal transformer 900 in FIG. 9 is further represented as an inductance 1000 inserted in a series into a transmission line as shown in FIG. 10. This inductance 1000 increases the impedance of the inductor electrode 605.

Thus, it is possible to obtain the inductor of the high impedance without routing the inductor electrode long, and a miniaturized resonance frequency adjusting apparatus can be obtained by using it as the choke coil 701 in FIG. 7.

Figure 11:
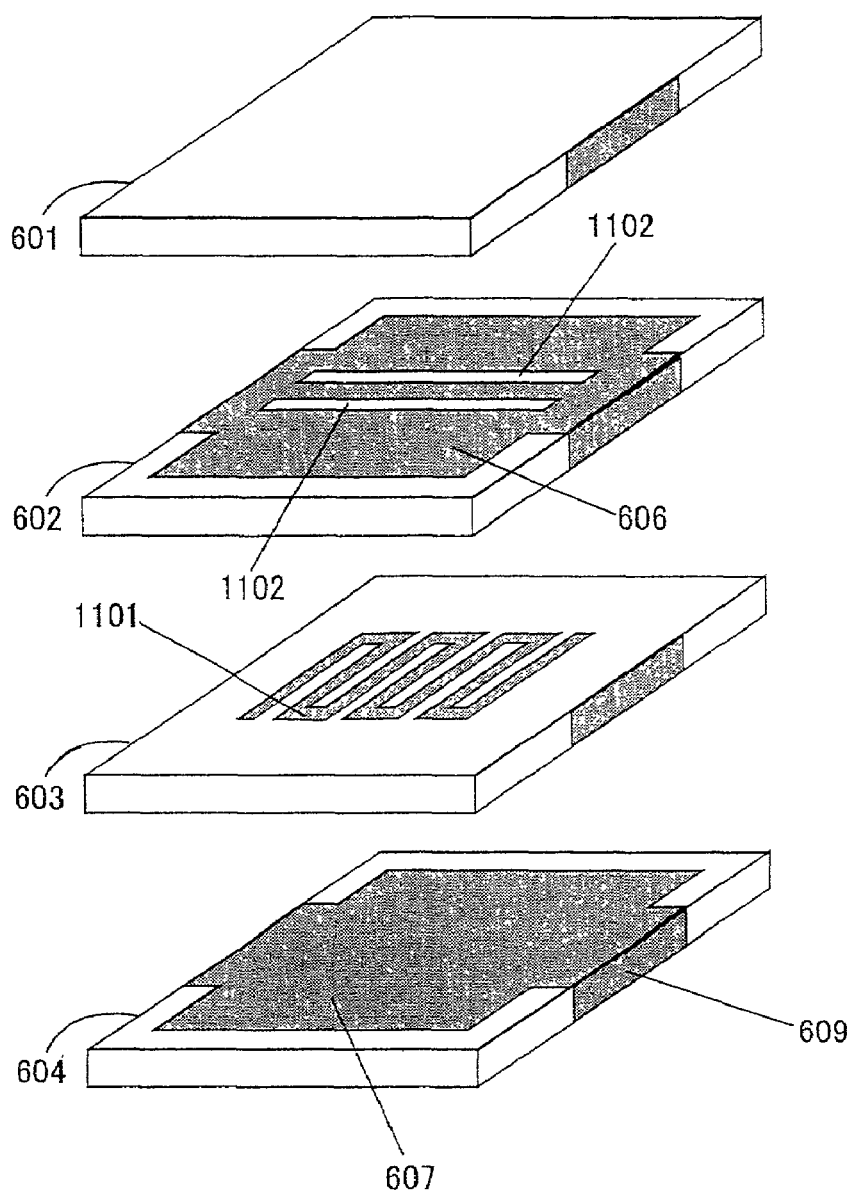
FIG. 11 is a diagram of the internal configuration of the multilayer electronic component in the third embodiment of the present invention.

Moreover, it is possible to obtain the same effects from the inductor electrode 605 by rendering it as a meander-shaped inductor electrode 1101 that is a continuous form of folded electrodes as shown in FIG. 11 to have the configuration such as a straight-line slot 1102.

In addition, while the shape of the slot should most desirably be orthogonal to the drawing direction of the inductor electrode just like the slots 608*a* to 608*d* in FIG. 6, it does not have to be limited thereto, and it may be just crossing in any angle or parallel with the drawing direction of the slot. Moreover, the shape of the slot may be curving or winding instead of the straight line. It may have a congruent pattern with the inductor electrode. The number of the slots may be four or more, or it may be just one. To put it briefly, the slots of the present invention are not limited as to their shapes and the number, but it is sufficient if they can partially reduce the area of the grounded electrode close to the inductor electrode so as to create the configuration wherein the inductor electrode is not placed to be sandwiched between the grounded electrodes.

Fourth Embodiment

Figure 12:
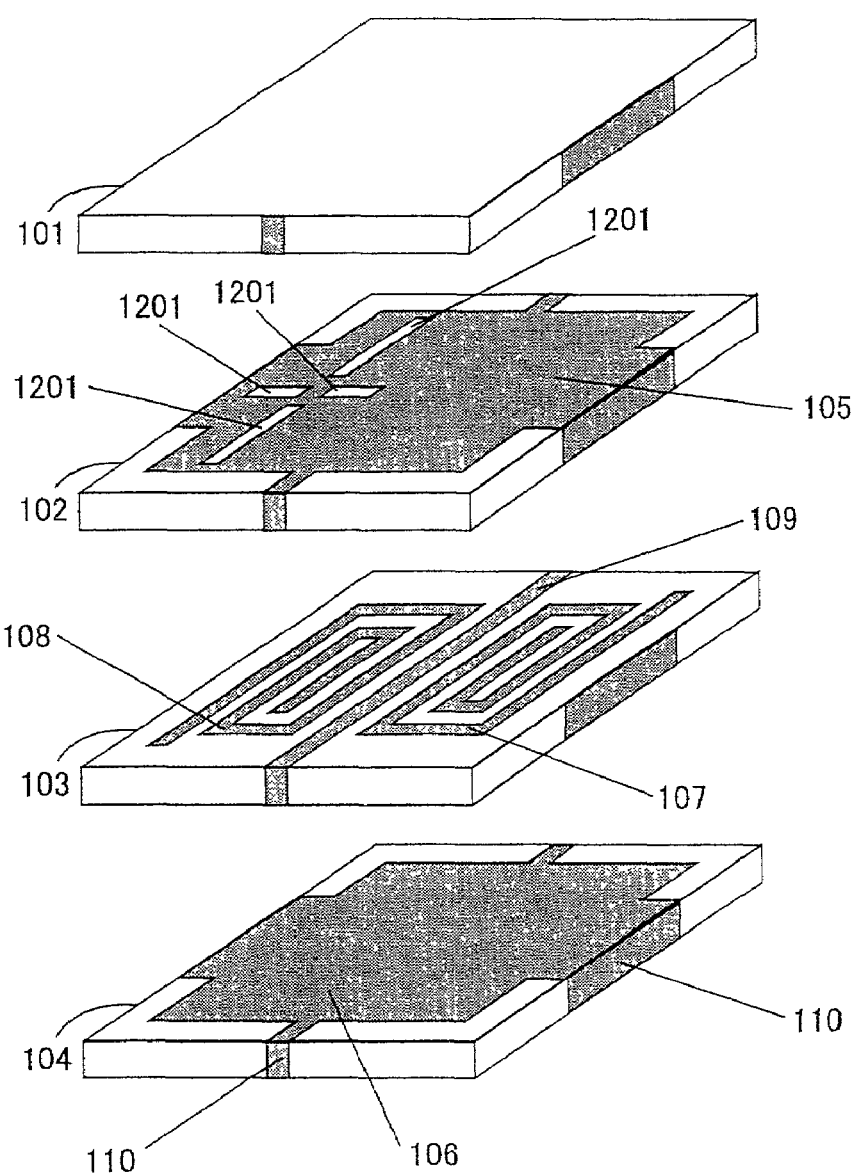
FIG. 12 is a diagram of the internal configuration of the multilayer electronic component in the fourth embodiment of the present invention.
Figure 13:
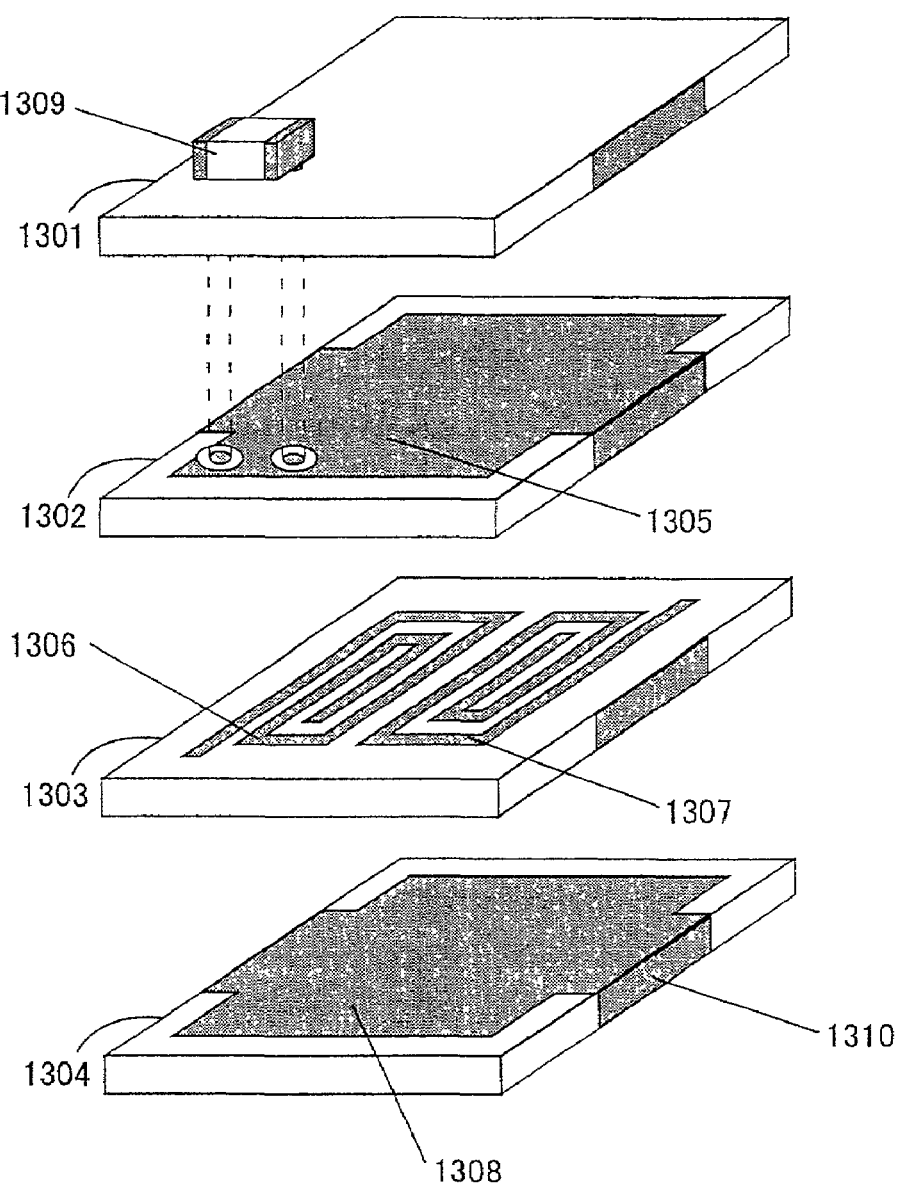
FIG. 13 is a diagram of the internal configuration of the multilayer electronic component in the past.

FIG. 12 is a diagram showing the internal configuration of the multilayer electronic component according to the fourth embodiment of the present invention. However, the portions that are the same as or corresponding to FIG. 1 are numbered likewise and detailed description thereof is omitted. The inductor electrodes 107 and 108 have the grounded electrodes 105 placed nearly on their entire top surfaces, and a slot 1201 possibly orthogonal to the inductor electrodes 108 is opened in the portion of the grounded electrodes opposite to the inductor electrode 108. Like the inductor electrode 605 in the third embodiment of the present invention, the inductor electrode 108 can operate as the inductor of the high impedance by placing the slot 1201 in the grounded electrode 105.

Such a multilayer electronic component as shown in FIG. 12 may be used in the same electronic parts as in the first and second embodiments. To be more specific, in the case of using it in the divider having the high-pass filter and the low-pass filter as shown in FIG. 5, the inductor formed by the inductor electrode 107 should be used for the high-pass filter and the inductor of the high impedance formed by the inductor electrode 108 should be used for the low-pass filter so that, as the low-pass filter has the lower passing band, the inductor in the low-pass filter operates as the inductor having the higher impedance than the one in high-pass filter. Thus, it is possible to implement the multilayer electronic component having the inductor of the optimum impedance as a whole.

In addition, it may also be used in the divider having the high-pass filter and the band pass filter.

In this case, it is desirable to use the inductor formed by the inductor electrode 107 for the high-pass filter and use the inductor of a high impedance formed by the inductor electrode 108 for the band pass filter having the lower passing band than the high-pass filter. It is because, as the band pass filter has the lower passing band of the signal, the inductor in the band pass filter needs to be one having the higher impedance than the one in the high-pass filter. Thus, it is possible to implement the multilayer electronic component having the inductor of the optimum impedance.

Moreover, it may also be used in the divider having the low-pass filter and the band pass filter.

In this case, it is desirable to use the inductor formed by the inductor electrode 107 for the band pass filter and use the inductor of the high impedance formed by the inductor electrode 108 for the low-pass filter. It is because, as the low-pass filter has the lower passing band, the inductor in the low-pass filter needs to be one having the higher impedance than the one in the band pass filter. Thus, it is possible to implement the multilayer electronic component having the inductor of the optimum impedance.

In addition, it may also be used in the divider having two band pass filters of mutually different frequency bands.

In this case, it is desirable to use the inductor formed by the inductor electrode 107 for one of the band pass filters and use the inductor of the higher impedance formed by the inductor electrode 108 for the band pass filter having the passing band lower than the other band pass filter. It is because the inductor in the band pass filter on the low-frequency side needs to be one having the higher impedance than the one in the band pass filter on the high-frequency side. Thus, it is possible to implement the multilayer electronic component having the inductor of the optimum impedance.

In addition, it is also feasible to use it in the divider having the circuit on the DCS side and the circuit on the GSM side as shown in FIGS. 5 and 16. Especially, in this case, the inductor electrode 108 should be used as the inductor Lg configured in the first low-pass filter 501, and the inductor electrode 107 should be used as the inductor Lp configured in the high-pass filter 502.

It is also feasible to use the inductor electrode 107 as the inductor L12 configured in the DCS receiving circuit 515 and use the inductor electrode 108 as the inductor L6 configured in the GSM receiving circuit 513.

Moreover, it is also feasible to use the inductor electrode 107 as the inductor L11 configured in the DCS transmitting circuit 514 and use the inductor electrode 108 as the inductor L3 configured in the GSM transmitting circuit 512.

Furthermore, it is also feasible to use the inductor electrode 107 as an inductor L7 configured in the third low-pass filter 504 and use the inductor electrode 108 as an inductor L2 configured in the second low-pass filter 503.

To put it briefly, it is desirable to use the inductor formed by the inductor electrode 107 on the circuit on the DCS side, and use the inductor of the high impedance formed by the inductor electrode 108 on the circuit on the GSM side. It is because, as the circuit on the GSM side has the lower passing band as shown in FIG. 3, the inductor on the circuit on the GSM side needs to be one having a higher impedance than the one on the circuit on the DCS side.

Furthermore, on the DCS circuit 517, it is also feasible to use the inductor electrode 107 as all or part of the inductor Lp configured in the high-pass filter 502, the inductor L7 configured in the third low-pass filter 504 and the inductor L12 configured in the DCS receiving circuit 515, and use the inductor electrode 108 as the inductor Lcc2 configured in the DCS transmitting circuit 514.

Moreover, on the GSM circuit 516, it is also feasible to use the inductor electrode 107 as all or part of the inductor Lg configured in the first low-pass filter 501, the inductor L2 configured in the second low-pass filter 503 and the inductor L6 configured in the GSM receiving circuit 513, and use the inductor electrode 108 as the inductor Lcc1 configured in the GSM transmitting circuit 512.

To put it briefly, it is desirable to use the inductor formed by the inductor electrode 107 on the circuit including the ordinary inductor and use the inductor of the high impedance formed by the inductor electrode 108 on the circuit including the choke coil.

It is because, as the choke coils Lcc1 and Lcc2 are the means of blocking the high-frequency signal just as in the case of the divider in FIG. 2, they require the higher impedance than the inductors comprising the RF circuit such as the filter.

Thus, it is possible to implement the multilayer electronic component having the inductor of the optimum impedance.

In addition, it is also feasible to use it in the divider having the circuit on the CDMA2000 side and the circuit on the AMPS side.

In this case, it is desirable to use the inductor formed by the inductor electrode 107 on the circuit on the CDMA2000 side and use the inductor of the higher impedance formed by the inductor electrode 108 on the circuit on the AMPS side.

It is because, as the circuit on the AMPS side has the lower passing band as shown in FIG. 3, the inductor on the circuit on the AMPS side needs to be one having the higher impedance than the one on the circuit on the CDMA2000 side. Thus, it is possible to implement the multilayer electronic component having the inductor of the optimum impedance.

Moreover, it is also feasible to use it in the divider having the circuit on the W-CDMA side and the circuit on the PDC side. In this case, it is desirable to use the inductor formed by the inductor electrode 107 on the circuit on the W-CDMA side and use the inductor of the high impedance formed by the inductor electrode 108 on the circuit on the PDC side. It is because, as the circuit on the PDC side has the lower passing band as shown in FIG. 3, the inductor on the circuit on the PDC side needs to be one having the higher impedance than the one on the circuit on the W-CDMA side. Thus, it is possible to implement the multilayer electronic component having the inductor of the optimum impedance.

In addition, it is also feasible to use it in the divider having the circuit on the W-CDMA side and the circuit on the GSM side. In this case, it is desirable to use the inductor formed by the inductor electrode 107 on the circuit on the W-CDMA side and use the inductor of the high impedance formed by the inductor electrode 108 on the circuit on the GSM side. It is because, as the circuit on the GSM side has the lower passing band as shown in FIG. 3, the inductor on the circuit on the GSM side needs to be one having the higher impedance than the one on the circuit on the W-CDMA side. Thus, it is possible to implement the multilayer electronic component having the inductor of the optimum impedance.

Moreover, it is also feasible to use it in the divider having the circuit on the W-CDMA side and the circuit on the DCS side. In this case, it is desirable to use the inductor formed by the inductor electrode 107 on the circuit on the W-CDMA side and use the inductor of the high impedance formed by the inductor electrode 108 on the circuit on the DCS side. It is because, as the circuit on the DCS side has the lower passing band as shown in FIG. 3, the inductor on the circuit on the DCS side needs to be one having the higher impedance than the one on the circuit on the W-CDMA side. Thus, it is possible to implement the multilayer electronic component having the inductor of the optimum impedance.

Moreover, while it was described on the assumption that the number of the inductor electrodes to be placed on the dielectric layer is one or two in each of the above embodiments, this invention does not limit it thereto so that three or more inductor electrodes may be provided on the same dielectric layer. In addition, it is also feasible to have a single inductor electrode or a plurality of inductor electrodes on each of mutually different dielectrics.

In addition, while it was described on the assumption that the number of the grounded electrodes sandwiching the dielectric layer having the inductor electrodes is two like the grounded electrodes 105 and 106 of the first embodiment, this invention does not limit it thereto so that it may have the configuration wherein a plurality of inductor electrodes are sandwiched by a plurality of grounded electrodes over and over. To put it briefly, it is sufficient if, of the plurality of inductor electrodes, there is at least one placed not to be sandwiched by the plurality of grounded electrodes or if, of the plurality of inductor electrodes, a portion of one inductor electrode or the plurality of inductor electrodes is placed not to be sandwiched thereby.

Figure 14:
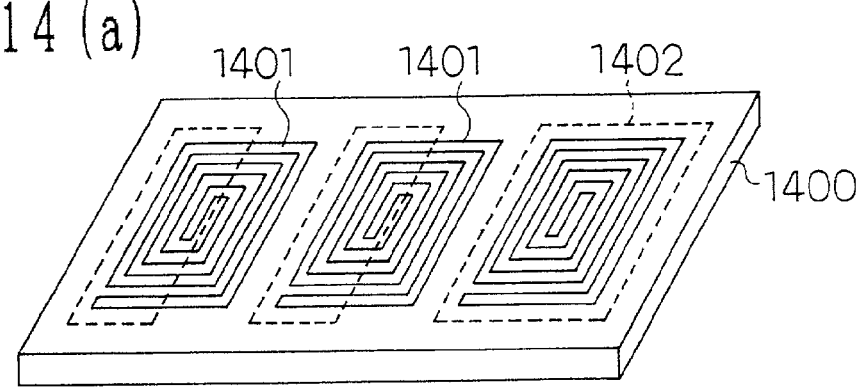
FIG. 14 is a diagram showing an example of placement of the inductor electrodes of the present invention.
Figure 14:
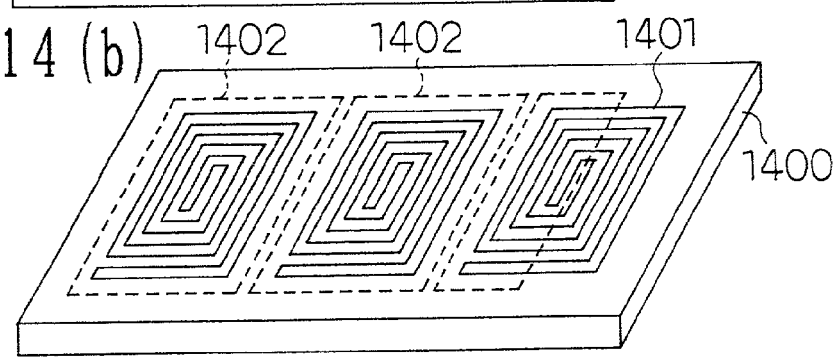
Figure 14:
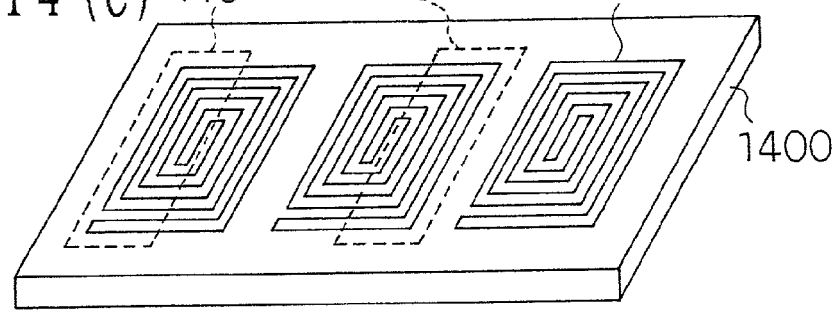
Figure 14:
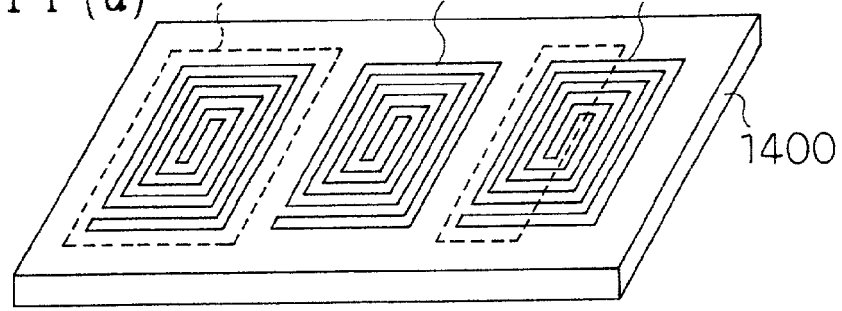

Here, FIG. 14 schematically shows an example of an array of the inductor electrodes of the present invention. In FIGS. 14A to 14D, reference numeral 1400 denotes the dielectric layer, and 1401, 1402 and 1403 denote the inductor electrodes placed on one principal plane of the dielectric layer 1400.

The inductor electrode 1401 has a portion thereof sandwiched by the plurality of grounded electrodes, the inductor electrode 1402 has the entirety thereof sandwiched by the plurality of grounded electrodes, and the inductor electrode 1403 is placed not to be sandwiched by the plurality of grounded electrodes. As for the inductor electrodes 1401 and 1402, however, the portions sandwiched by the grounded electrodes are schematically indicated by dashed lines.

As shown in FIGS. 14A and 14B, the inductor electrodes placed on the top surface of the dielectric layer 1400 may be the inductor electrode 1401 with only a portion thereof sandwiched by the plurality of grounded electrodes and the inductor electrode 1402 entirely sandwiched by the plurality of grounded electrodes, or as shown in FIG. 14C, the inductor electrodes placed on the top surface of the dielectric layer 1400 may be the inductor electrode 1401 with only a portion thereof sandwiched by the plurality of grounded electrodes and the inductor electrode 1403 not sandwiched by the plurality of grounded electrodes. In addition, as shown in FIG. 14D, the inductor electrodes placed on the top surface of the dielectric layer 1400 may be a mixture of the inductor electrode 1401 with only a portion thereof sandwiched by the plurality of grounded electrodes, the inductor electrode 1403 not sandwiched by the plurality of grounded electrodes, and the inductor electrode 1402 sandwiched by the plurality of grounded electrodes.

Figure 17:
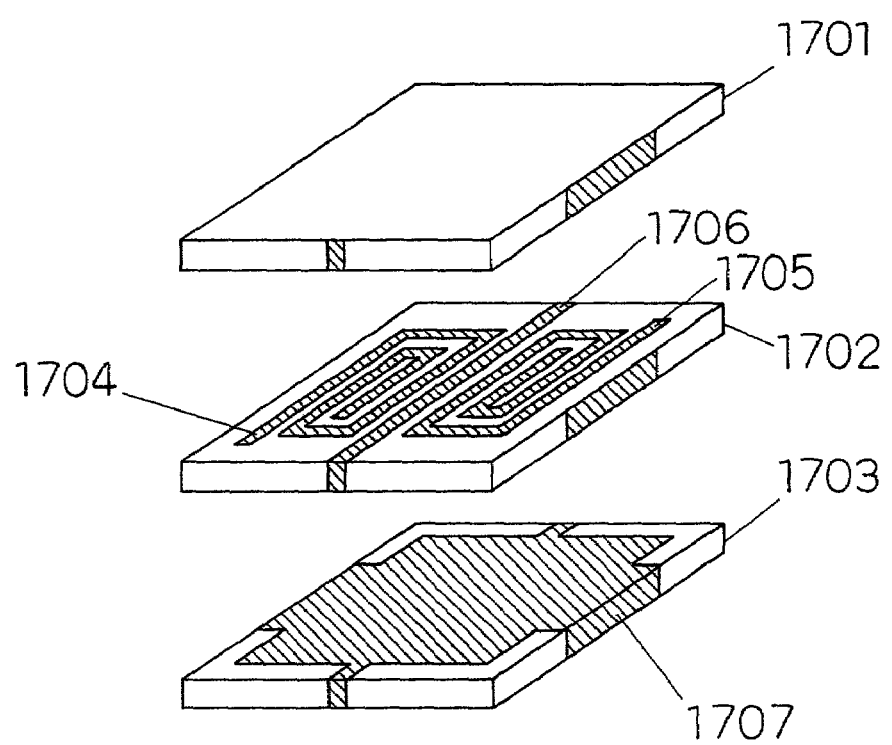
FIG. 17 is a diagram showing another embodiment of the multilayer electronic component of the present invention.

Furthermore, the present invention may have a configuration example shown in FIG. 17. As for the multilayered inductor shown in FIG. 17, reference numerals 1701 to 1703 denote the dielectric layers, 1707 denotes the grounded electrode, 1704 and 1705 denote the inductor electrodes, and 1706 denotes the internal grounded electrode, and composition of the layered ceramic product is the same as in the first embodiment. The inductor electrodes 1704 and 1705 are provided on the principal plane of the dielectric layer 1702, and furthermore, the internal grounded electrode 1706 is provided between the inductor electrodes 1704 and 1705. And the dielectric layer 1703 has the grounded electrode 106 placed nearly on its entire surface, and the grounded electrode 1707 and the internal grounded electrode 109 are connected by the side electrode.

As for such a multilayered inductor, both the inductor electrodes 1704 and 1705 are only opposite the grounded electrode 1707 and are not sandwiched by the two grounded electrodes, so that two inductor elements of the high impedance can be acquired.

In the divider having the GSM circuit and the DCS circuit shown in FIGS. 5 and 16, for instance, the inductor electrodes 1704 and 1705 of such a multilayered inductor can be used as the inductor Lcc2 configured in the DCS transmitting circuit 514 and the inductor Lcc1 configured in the GSM transmitting circuit 512. It is because, as the choke coils Lcc1 and Lcc2 are the means of blocking the high-frequency signal, they require the higher impedance than the inductors comprising the RF circuit such as the filter.

Figure 18:
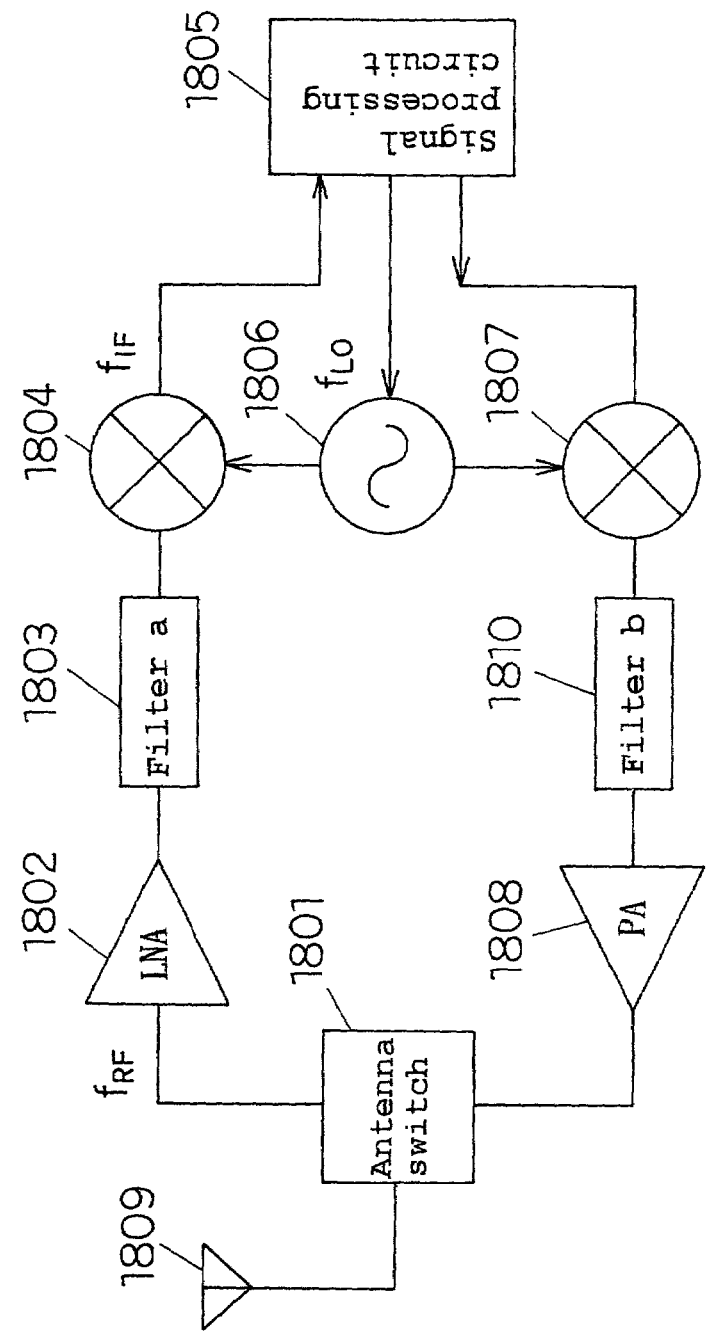
FIG. 18 is a block diagram showing the configuration of a communication apparatus.

Next, FIG. 18 shows an example of a communication apparatus using the present invention. The communication apparatus has a low noise amplifier (LNA) 1802, a filter a1803 and a mixer a1804. The parts are corresponding to transmission means of the present invention, a mixer b1807, a filter b1810 and a power amplifier (PA) 1808. The parts are corresponding to reception means of the present invention, an antenna switch 1801 for switching the connection between the transmission means or the reception means and an antenna 1809, a local oscillator 1806 for outputting an oscillation signal to the mixer a1804 and the mixer b1810 and a signal processing circuit 1805.

In such a communication apparatus, the signal $f_{RF}=f_{LO}-f_{IF}$ received by the antenna 1809 is inputted to the low noise amplifier 1802 by the antenna switch 1801, and passes through the filter a1803 for eliminating an image frequency shown by $f_{LO}-f_{IF}$ and then is inputted to the mixer a1804 (frequency converter) and converted to an intermediate frequency (IF) to be inputted to the signal processing circuit 1805. Moreover, $f_{LO}$ is generated in the local oscillator 1806.

On the other hand, a modulation signal outputted from a signal processing circuit 1805 on the transmission means side and converted to the frequency $f_{RF}$ by the local oscillator 1806 and the mixer b1810 passes through the filter b1810 and is outputted to the antenna 1809 from the antenna switch 1801 via the power amplifier 1808. Thus, communication operation in a microwave or millimeter wave sending band, for instance, is performed.

At this time, as the antenna switch 1801 includes the choke coil and the filters a1803 and b1810 include ordinary coils, it is possible to provide the optimum impedance for each of the means by one multilayer electronic component by using the multilayer electronic component of the present invention.

In addition, the antenna switch 1801 is a device immediately below the antenna for separating transmission and reception, and is used in a system wherein transmission and reception switching in a TDMA (Time Division Multiple Access) system such as the GSM or the DCS is performed by time division. Accordingly, in the case of using the divider in FIG. 5 as the antenna switch 1801, it is possible to use the multilayer electronic component of the present invention so as to obtain the optimum impedance and acquire a high-performance communication apparatus.

Moreover, the dielectric layer of each embodiment is an example of the dielectric sheet of the present invention.

As described above, according to the embodiments of the present invention, it is possible to obtain the inductor of the high impedance since the grounded electrodes are not provided close to the top surface of the inductor electrodes.

In addition, according to the embodiments of the present invention, it is possible to suppress mutual coupling between the inductors by placing the grounded electrodes among a plurality of inductor electrodes that are close.

Moreover, according to the embodiments of the present invention, it is possible to suppress the mutual coupling between the inductors by placing the via holes connected with the grounded electrodes among the plurality of inductor electrodes that are close.

In addition, according to the embodiments of the present invention, it is possible to obtain the inductor of the high impedance by placing on the grounded electrodes opposite the inductor electrodes the slots perpendicular to the inductor electrodes.

Furthermore, it is possible, by mounting the multilayer electronic component of this embodiment, to obtain the high-performance communication apparatus that is miniaturized and operates with the optimum impedance.

As described above, according to the present invention, it is possible to obtain the multilayer electronic component operating as the inductor of the high impedance.

In addition, according to the present invention, it is possible to suppress mutual coupling between the plurality of inductors.

What is claimed is:

1. A multilayer electronic component having a multilayered product laminating a plurality of dielectric sheets as one piece,
- a first grounded electrode provided on one surface of a first dielectric sheet of said plurality of dielectric sheets,
- a second grounded electrode provided on one surface of a second dielectric sheet of said plurality of dielectric sheets,
- at least one inductor electrode provided on one surface of a third dielectric sheet of said plurality of dielectric sheets, said third dielectric sheet is sandwiched between said first and second dielectric sheets, wherein,
- said at least one inductor electrode is formed by connecting a plurality of striplines having a line-shape,
- said first grounded electrode has at least one slot having a rectangle pattern, and
- a projection image of said slot to the surface of said third dielectric sheet is crossed to at least one of the plurality of striplines of said at least one inductor electrode.

2. A communication apparatus having:
- reception means of receiving a signal from an antenna, having at least a low noise amplifier, a filter and a mixer;
- transmission means of transmitting the signal from said antenna, having at least a mixer, a filter and a power amplifier;
- an antenna switch for switching a connection between said antenna and said reception means or said transmission means, whereas:
- the multilayer electronic component according to claim 1 is used in all or part of the filter of said transmission means, the filter of said reception means, and said antenna switch.

3. The multilayer electronic component according to claim 1, wherein the projection image of said slot to the surface of said third dielectric sheet is substantially perpendicularly crossed to at least said one of the plurality of striplines of said inductor electrode.

* * * * *